(12) United States Patent
Simmen et al.

(10) Patent No.: US 9,558,251 B2
(45) Date of Patent: Jan. 31, 2017

(54) TRANSFORMATION FUNCTIONS FOR COMPRESSION AND DECOMPRESSION OF DATA IN COMPUTING ENVIRONMENTS AND SYSTEMS

(75) Inventors: David Simmen, Mountain View, CA (US); Shant Hovsepian, New York, NY (US); Jeffrey Davis, Santa Clara, CA (US)

(73) Assignee: Teradata US, Inc., Dayton, OH (US)

( * ) Notice: Subject to any disclaimer, the term of this patent is extended or adjusted under 35 U.S.C. 154(b) by 0 days.

(21) Appl. No.: 13/478,284

(22) Filed: May 23, 2012

(65) Prior Publication Data

US 2013/0262408 A1  Oct. 3, 2013

Related U.S. Application Data

(60) Provisional application No. 61/619,893, filed on Apr. 3, 2012.

(51) Int. Cl.
*G06F 17/30* (2006.01)
*H03M 7/30* (2006.01)

(52) U.S. Cl.
CPC ... *G06F 17/30569* (2013.01); *G06F 17/30283* (2013.01); *G06F 17/30312* (2013.01); *H03M 7/30* (2013.01); *H03M 7/70* (2013.01); *H03M 7/702* (2013.01)

(58) Field of Classification Search
CPC .......... G06F 17/30283; G06F 17/30312; G06F 17/30569; H03M 7/30
USPC .................................. 707/693, 756
See application file for complete search history.

(56) References Cited

U.S. PATENT DOCUMENTS

| | | | | |
|---|---|---|---|---|
| 6,751,177 B1* | 6/2004 | Abe | ................ | G11B 20/00007 341/61 |
| 6,760,845 B1* | 7/2004 | Cafarelli | ................. | H04L 41/24 726/22 |
| 2002/0019881 A1* | 2/2002 | Bokhari | ............ | G06F 17/30905 709/246 |
| 2002/0021842 A1* | 2/2002 | Lee | ........................ | G06F 17/147 382/233 |
| 2002/0165988 A1* | 11/2002 | Khan | ................ | G06F 17/30905 709/246 |
| 2006/0294173 A1* | 12/2006 | Hallapuro | ............. | G06F 17/147 708/402 |

(Continued)

*Primary Examiner* — Phong Nguyen
(74) *Attorney, Agent, or Firm* — Ramin Mahboubian

(57) ABSTRACT

One or more transformation functions can be used in connection or together with one or more compression/decompression techniques. A transformation function can transform data (e.g., a data object) into a form more suitable for compression and/or decompression. As a result, data can be compressed and/or decompressed more effectively. In addition, multiple data objects can be associated with various transformation functions and/or compression/decompression techniques. As a result, different approaches can be taken with respect to compression and decompression of data objects in an effort to find an optimum approach for compression of data objects that may vary significantly from each other and change over time. It will be appreciated that the objects can be associated with transformation functions in a dynamic manner to accommodate changes to data. Also, an extendible and/or extensible system can allow for growth and adaption of new data in forms not currently present or expected.

25 Claims, 18 Drawing Sheets

(56) References Cited

U.S. PATENT DOCUMENTS

| | | | |
|---|---|---|---|
| 2007/0011343 A1* | 1/2007 | Davis | H04L 29/06027 709/231 |
| 2007/0058730 A1* | 3/2007 | Bowra | H04N 21/2389 375/240.28 |
| 2008/0152235 A1* | 6/2008 | Bashyam | G06F 17/30153 382/224 |
| 2008/0154928 A1* | 6/2008 | Bashyam | H03M 7/30 707/E17.002 |
| 2008/0177864 A1* | 7/2008 | Minborg | G06F 17/3002 709/219 |
| 2011/0072321 A1* | 3/2011 | Dhuse | G06F 11/1076 714/55 |
| 2011/0113304 A1* | 5/2011 | Heinrich | G11B 20/1803 714/763 |
| 2012/0087582 A1* | 4/2012 | Bauchot | G06T 3/4084 382/167 |
| 2012/0201476 A1* | 8/2012 | Carmel | H04N 19/176 382/239 |

* cited by examiner

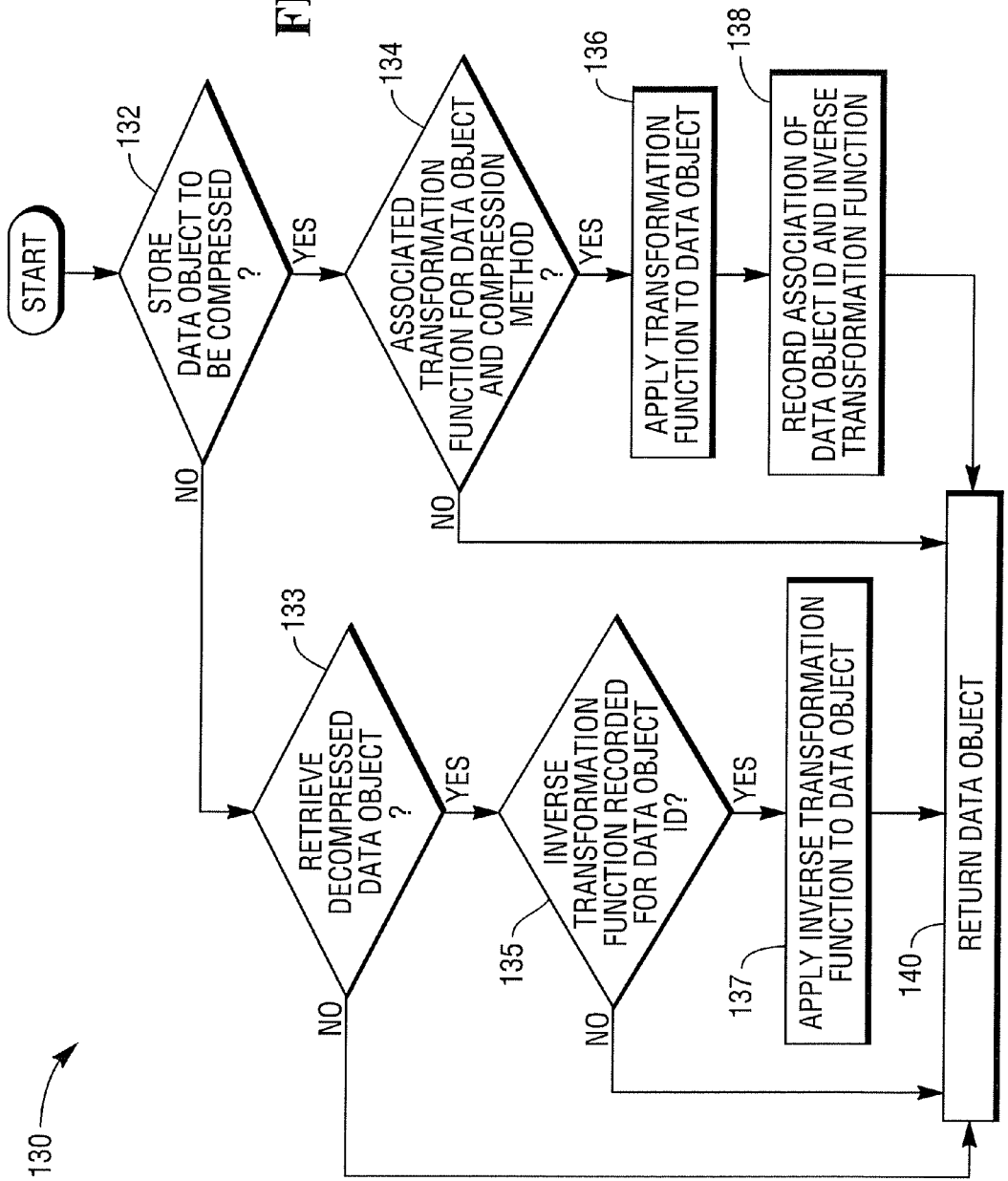

Expand on "lookup association" aspect receive (DO), CM)

//look for static association
if ( specific static association entry (DO.id, CM)=>(TF, ITF) OR
    type static association entry (DO.type, CM)=>(TF, ITF) them
        return (TF, ITF)
endif //look for dynamic association
foreach (dynamic association entry ( DDTM , CM)=>(TF, ITF)
    if (DDTM.examine (DO) == true)
        return (TF, ITF)
    endif
end for each return (NULL, NULL)

FIG. 1E

DDTM - determine monotonically increasing N x M

```
receive (DO)
numblocks = number of N x M sized data blocks in DO
random block id array = S sized random sample of block address of DO prevD = x'00 00 00 00 00;

Foreach block address BA in random block id array
    read block BA into B
    foreach ( data value D in block B)
        if D <= prevD)
            return false
        else
            prevD = D;
        end for each D
    End foreach block B
Return true
```

FIG. 1F

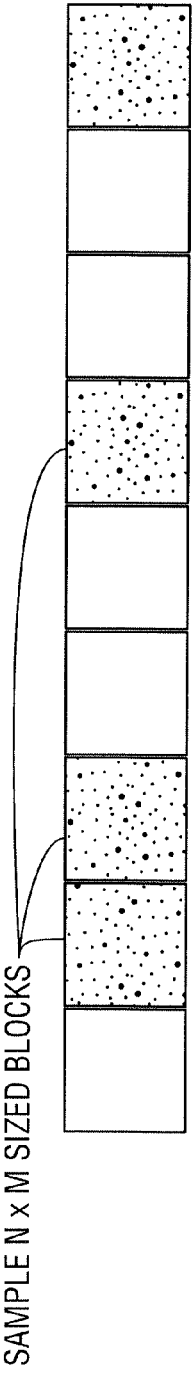

SAMPLE N x M SIZED BLOCKS

FIG. 1G

```
examine(data object DO) {
    sample = random sample of block addresses of DO
    prev_value = MIN_VALUE foreach block address BA in sample:
        read BA into memory block B
        foreach data value D in B {
            if D <= prev_value
                return false
            else
                prev_value = D
        }
        prev_value = MIN_VALUE
    }
    return true
}
```

FIG. 1I

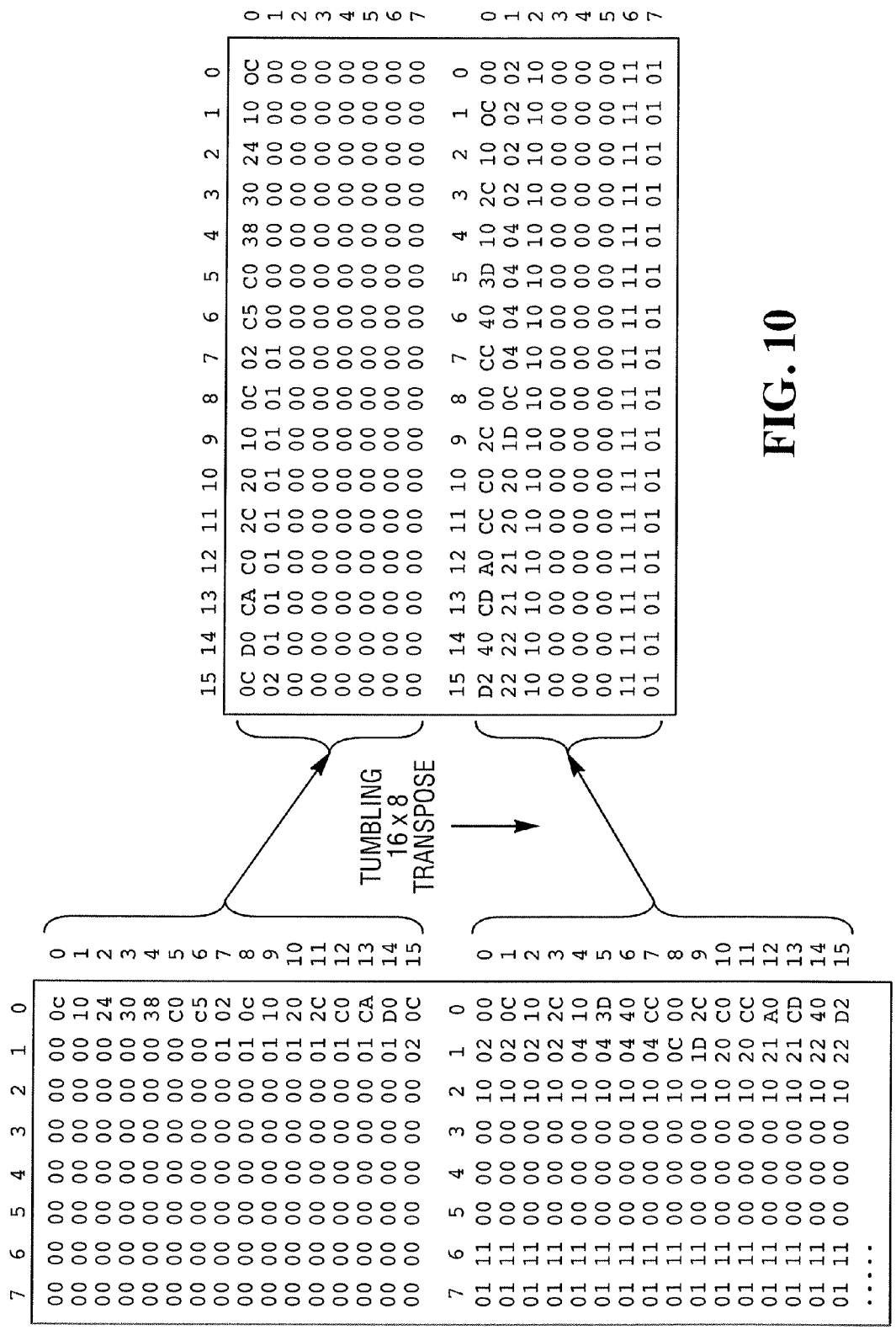

```
/*
** Tumble over InBuf transposing numrows x numcols bytes into outBuf.
*/
transpose (char* outBuf, char* inBuf, int size, int numrows, int numcols)
{ //transpose for (int i = 0 ; i < (size / (numrows * numcols)); i++)
    {    // for tumbles /*
        ** Tumble across the buffer the size of the matrix.
        */
        outbuf += i * (numrows * numcols);
        inbuf += i * (numrows * numcols);

/*
        ** will make numcols passes over inBuf. on the ith pass, it will write
        ** the ith column of the matrix into the ith row of the transposed matrix.
        */
        for (i = 0; i < numcols - 1; i++)
        {
            //for each column of the input matrix for (j = 0; j < numrows -1; j++)
            {
                //for each row of the input matrix /*
                ** outBuf[i, j] = inBuf[j, i]
                */
                outBuf + (i * numrows) + j = inBuf + (j * numcols) + i;

} //end for each row of the input matrix

} //end for each column of the input matrix

} //end for tumbles

}//end transpose
```

FIG. 11

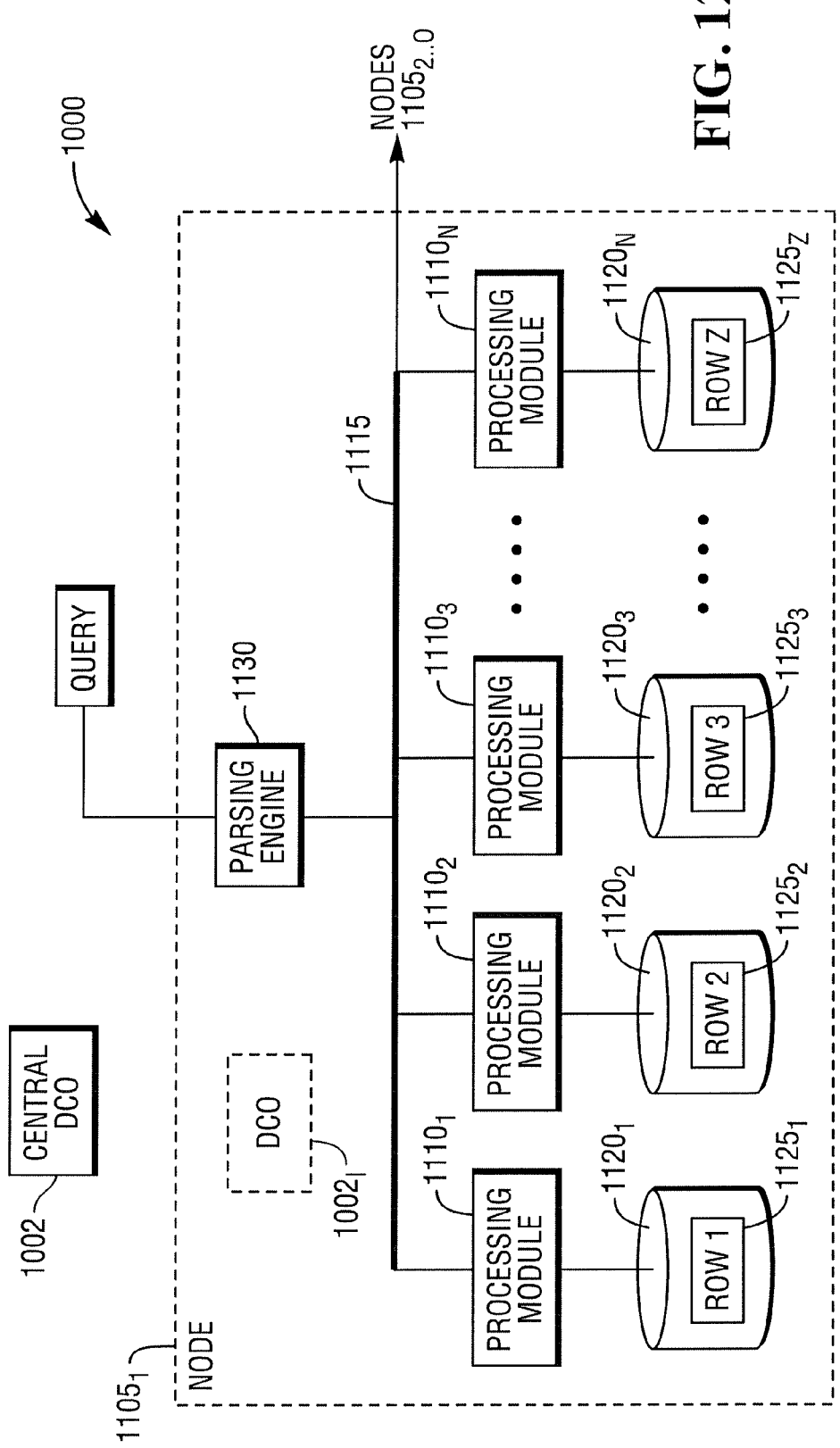

TRANSFORMATION FUNCTIONS FOR COMPRESSION AND DECOMPRESSION OF DATA IN COMPUTING ENVIRONMENTS AND SYSTEMS

CROSS REFERENCE TO RELATED APPLICATIONS

This application takes priority of the U.S. Provisional Patent Application No. 61/619,893, entitled "TRANSFORMATION FUNCTIONS FOR COMPRESSION AND DECOMPRESSION OF DATA IN COMPUTING ENVIRONMENTS AND SYSTEMS," by David Simmen, filed on Apr. 3, 2012, which is hereby incorporated by reference herein in its entirety and for all purposes.

BACKGROUND

Data can be an abstract term. In the context of computing environments and system, data can be generally encompassing of all forms of information that can be stored in a computer readable medium (e.g., memory, hard disk). Data and in particular, one or more instances of data can also be referred to as data object(s). As is generally known in the art, a data object can for example, be an actual instance of data, a class, type, or form data, and so on.

Data compression can play an important role in various computing environments and computer systems that are presently in use today. Generally, data compression can reduce the storage space needed to store data in a computing environment or system. In addition, network and Input/output (I/O) bandwidth can be improved by compressing data in a compressed form and using the compressed form to, for example, read, write and/or exchange data over a network.

As such, the importance of data compression is well recognized. This importance is further evidenced by the large number of data compression techniques (or methods or functions) that are widely known and used today.

One example of a computing environment or system where compression can be highly useful is a database environment or system which will be described in greater detail below since it may be more instructive to demonstrate the demonstrate the even increasing need for compression of data.

The term database can refer to a collection of data and/or data structures typically stored in a digital form. Data can be stored in a database for various reasons and to serve various entities or "users." Generally, data stored in the database can be used by the database users. A user of a database can, for example, be a person, a database administrator, a computer application designed to interact with a database, etc. A very simple database or database system can, for example, be provided on a Personal Computer (PC) by storing data on a Hard Disk (e.g., contact information) and executing a computer program that allows access to the data. The executable computer program can be referred to as a database program or a database management program. The executable computer program can, for example, retrieve and display data (e.g., a list of names with their phone numbers) based on a request submitted by a person (e.g., show me the phone numbers of all my friends in Ohio).

Generally, database systems are much more complex than the example noted above. In addition, databases have been evolved over the years and some databases that are for various business and organizations (e.g., banks, retail stores, governmental agencies, universities) in use today can be very complex and support several users simultaneously by providing very complex queries (e.g., give me the name of all customers under the age of thirty five (35) in Ohio that have bought all items in a list of items in the past month in Ohio and also have bought ticket for a baseball game in San Diego and purchased a baseball in the past 10 years).

Typically, a Database Manager (DM) or a Database Management System (DBMS) is provided for relatively large and/or complex databases. As known in the art, a DBMS can effectively manage the database or data stored in a database, and serve as an interface for the users of the database. A DBMS can be provided as an executable computer program (or software) product as is also known in the art.

It should also be noted that a database can be organized in accordance with a Data Model. Notable Data Models include a Relational Model, an Entity-relationship model, and an Object Model. The design and maintenance of a complex database can require highly specialized knowledge and skills by database application programmers, DBMS developers/programmers, database administrators (DBAs), etc. To assist in design and maintenance of a complex database, various tools can be provided, either as part of the DBMS or as free-standing (stand-alone) software products. These tools can include specialized Database languages (e.g., Data Description Languages, Data Manipulation Languages, Query Languages). Database languages can be specific to one data model or to one DBMS type. One widely supported language is Structured Query Language (SQL) developed, by in large, for Relational Model and can combine the roles of Data Description Language, Data Manipulation language, and a Query Language.

Today, databases have become prevalent in virtually all aspects of business and personal life. Moreover, database use is likely to continue to grow even more rapidly and widely across all aspects of commerce. Generally, databases and DBMS that manage them can be very large and extremely complex partly in order to support an ever increasing need to store data and analyze data. Typically, larger databases are used by larger organizations. Larger databases are supported by a relatively large amount of capacity, including computing capacity (e.g., processor and memory) to allow them to perform many tasks and/or complex tasks effectively at the same time (or in parallel). On the other hand, smaller databases systems are also available today and can be used by smaller organizations. In contrast to larger databases, smaller databases can operate with less capacity.

A popular type of database is the relational Database Management System (RDBMS), which includes relational tables, also referred to as relations, made up of rows and columns (also referred to as tuples and attributes). Each row represents an occurrence of an entity defined by a table, with an entity being a person, place, thing, or other object about which the table contains information.

In view of the ever increasing need to store more and more data in various computing environments and systems, compression techniques are very useful today and are likely to become even more useful in the future.

SUMMARY

Broadly speaking, the invention relates to computing environments and systems. More particularly, the invention relates to techniques for compression and decompression of data (e.g., data object) in computing environments and systems.

In accordance with one aspect of the invention, one or more transformation functions can be used in connection or together with one or more compression/decompression techniques. It will be appreciated that a transformation function can transform data (e.g., a data object) into a form more suitable for compression and/or decompression. As a result, data can be compressed and/or decompressed more effectively. By way of example, a transformation function can be applied to a data object to transform the data object from its original form to a form having relatively more recognizable repeated patterns, thereby allowing generating a compressed version of the transformed data that would be more condensed than a compressed version of the original form. In the example, after decompression of a compressed version of the transformed data, the original form (or the original data object) can be obtained by transforming a decompressed version of the compressed version of the transformed data. For example, the original data object can be obtained by using a second transformation function (e.g., an inverse or mirror transformation function of the first transformation function).

In accordance with another aspect of the invention, multiple data objects can be associated with various transformation functions and/or compression/decompression techniques. As a result, different approaches can be taken with respect to compression and decompression of data objects in an effort to find an optimal approach for various data objects of different forms and characteristics as well as data objects that can change over time. By way of example, a first data object may be associated (e.g., assigned) to a first transformation function designated to be used prior to using a particular compression technique, a second data object may be associated with a second transformation function designated to be used prior to using the same or an another compression technique, and a third data object may not be assigned to be transformed, and so on. It will be appreciated that the objects can be associated to transformation functions in a dynamic manner to accommodate changes to data. Also, an extendible and/or extensible system can be provided that allows for growth and adaption of new data in forms that may not be currently present or anticipated to be encountered in a system.

In accordance with other aspects of the invention, data can be compressed and decompressed in a form that may be more effective for the data at a given point in time.

Still other aspects, embodiment and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 1C depicts a method 130 for facilitating compression and decompression in accordance with one embodiment of the invention.

FIG. 1E shows pseudo code for determining, retrieving or looking up an association in accordance with one embodiment of the invention.

FIG. 1F shows pseudo code for an exemplary dynamic transformation function for examining a data object in accordance with one embodiment of the invention.

FIG. 1G illustrates that a data object can be sampled by examining only a number of N×M sized blocks in accordance with one embodiment of the invention.

FIG. 1I depicts an exemplary function that can be used to determine if a Data Object with no specific association is a candidate for a dynamically-associated M×N matrix transpose transformation function in accordance with one embodiment of the invention.

FIG. 10 illustrates an example of a transposing function that can be used in a database environment in accordance with one embodiment of the invention.

FIG. 11 shows pseudo code for a tumbling matrix transpose transformation in accordance with one embodiment of the invention.

FIG. 12 depicts a database node of a database system or Database Management System (DBMS) in accordance with one embodiment of the invention.

DETAILED DESCRIPTION

Figure 1A:
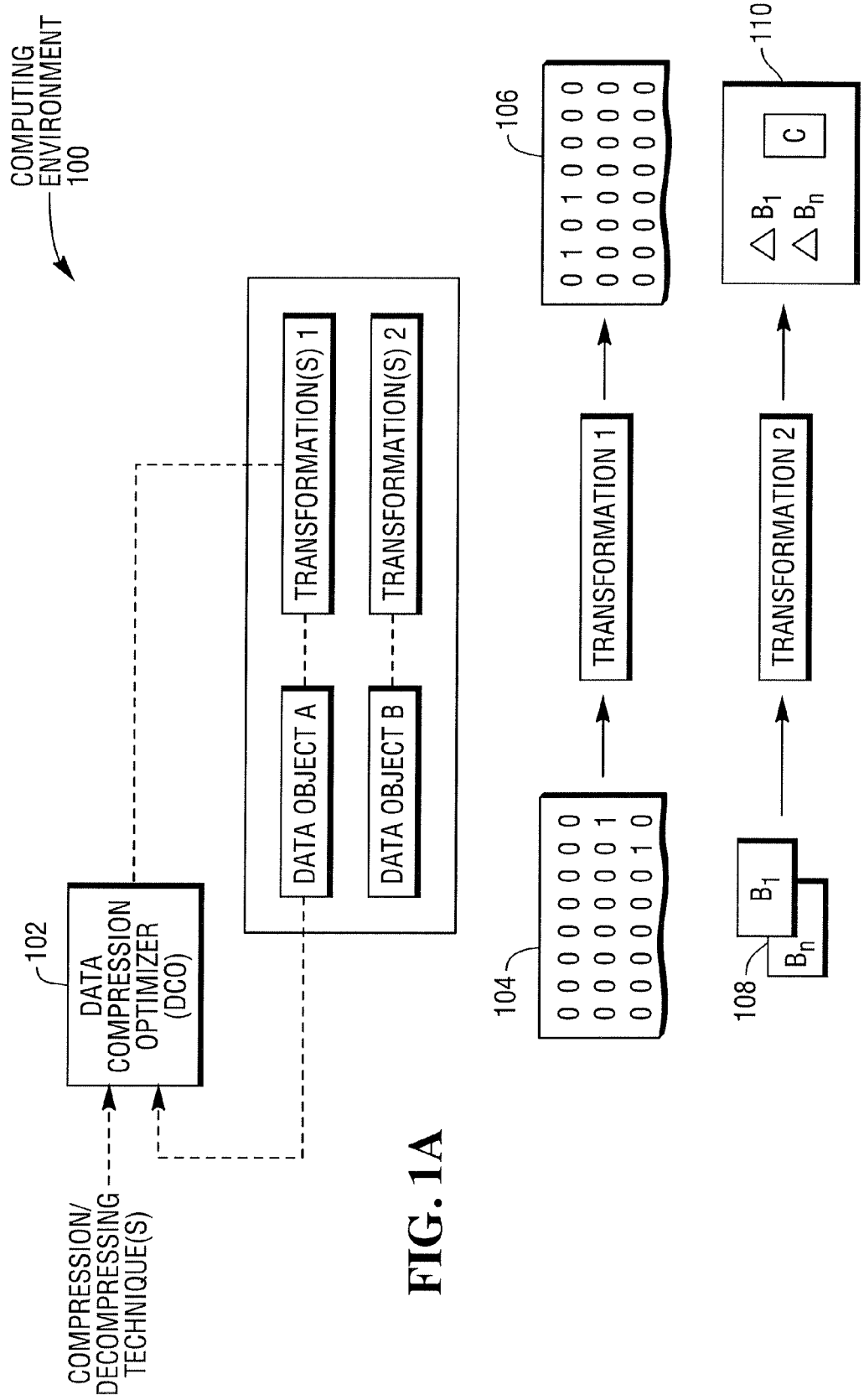
FIG. 1A depicts a computing environment that includes a data compression and/or decompression optimizer in accordance with one embodiment of the invention.

As noted in the background section, compression techniques can play an important role in various computing environments and systems. As such, generally compression techniques are very useful as they allow compressing data in a more compact form which may, for example, take less storage, take less bandwidth to transmit, and so on.

However, a general-purpose compression technique may achieve good results (e.g., relatively compressed data) on one class of data but might achieve poor results on another class of data. As such, as the size and type of data grows, it is more unlikely that a single compression technique could be used to produce good results. Further, it may not be possible, desirable or feasible to use multiple compression techniques. Moreover, some data may not be suitable for compression with any one of the multiple compression techniques that may be in use in a particular computing environment and system. It should also be noted that although it may be possible to designed customized compression techniques, a significant amount of resources (e.g., engineering and programming) would be required to do so. Also, it may be desirable and/or feasible to use existing compression techniques in some applications as, for example, a compression technique may be well established and/or implemented in Hardware. Thus, improved compression techniques would be very useful.

It will be appreciated that one or more transformation functions can be used in connection or together with one or more compression/decompression techniques in accordance with one aspect of the invention. In doing so, a transformation function can transform data (e.g., a data object) into a form more suitable for compression and/or decompression. As a result, data can be compressed and/or decompressed more effectively. By way of example, a transformation function can be applied to a data object to transform the data object from its original form to a form having relatively more recognizable repeated patterns, thereby allowing generating a compressed version of the transformed data that would be more condensed than a compressed version of the original form. In the example, after decompression of a compressed version of the transformed data, the original form (or the original data object) can be obtained by transforming a decompressed version of the compressed version of the transformed data. For example, the original data object can be obtained by using a second transformation function (e.g., an inverse or mirror transformation function of the first transformation function).

In accordance with another aspect of the invention, multiple data object can be associated with various transformation functions and/or compression/decompression techniques. As a result, different approaches can be taken with respect to compression and decompression of data objects in an effort to find an optimal approach for various data objects of different forms and characteristics as well as data objects that can change over time. By way of example, a first data object may be associated (e.g., assigned) to a first transformation function designated to be used prior to using a particular compression technique, a second data object may be associated with a second transformation function designated to be used prior to using the same or an another compression technique, and a third data object may not be assigned to be transformed, and so on. It will be appreciated that the objects can be associated to transformation functions in a dynamic manner to accommodate changes to data. Also, an extendible and/or extensible system can be provided that allows for growth and adaption of new data in forms that may not be currently present or anticipated to be encountered in a system.

In accordance with other aspects of the invention, data can be compressed and decompressed in a form that may be more effective for the data at a given point in time.

Embodiments of these aspects of the invention are also discussed below with reference to FIGS. 1A-12. However, those skilled in the art will readily appreciate that the detailed description given herein with respect to these figures is for explanatory purposes as the invention extends beyond these limited embodiments.

FIG. 1A depicts a computing environment 100 that includes a data compression and/or decompression optimizer (DCO) 102 in accordance with one embodiment of the invention. It will be appreciated that DCO 102 can, for example, be implemented in hardware and/or software, for example by using one or more hardware and software components. For example, the DCO 102 can be implemented by using computer executable code stored on a computer readable medium (not shown) and executed by one or more processors (not shown) that can be a part of a computing system or device as those skilled in the art will readily appreciate.

Referring to FIG. 1A, conceptually, the DCO 102 can make an association between at least one data object and at least one data transformation function (or transformation function). As those skilled in the art will readily appreciate, the database object can, for example, include a particular or specific data potion or segment, field (field of data) that may be represented as a series of Bytes (e.g., a series of ones and zeros). As another example, a data object can represent a class, type, or category of data sharing on or more common characteristic, belonging to a group, and/or related in one or more other ways.

In this context, at least one transformation function can be designated to transform a data object (e.g., a specific data portion, a class or type of data) from a first form received as input to a second form as output. Moreover, the DCO 102 can associate a data object to one or more data transformation functions that can be used in connection with compression and/or decompression of the database. It will be appreciated that as a result of applying the transformation function to a database object, compression and/or decompression of the database may be achieved in an optimal or more efficient than applying only a compression or decompression technique in a conventional way.

By way of example, DCO 102 can associate (e.g., designate for use) a data object A to one or more data transformation functions (1) to be used prior to compressing the data object A. In the example shown in FIG. 1A, as a first transposing (or transposition) function, a first transformation function (TF1) can effectively transpose a first representation of the data object A (104) to a second representation of the data object A (106) that may be more suitable and/or preferred for application of one or more compression techniques. In other words, using the same compression technique in both situations, compressing the second representation of the data object A (106) which is obtained by transforming the original data object A can, for example, result in a more compressed form that could be achieved by compressing the first representation of the data object A (104) because the data object A is transformed to a form that would have more repeated patterns (e.g., sequences of Zeros (0's)) than in the original form of the data object A. As will be described below in greater detail, the first transformation function (TF1) can also include also a transposing function (e.g., an inverse or mirror transposing function used prior to compressing the data object A) that can be used in connection with decompressing a compressed version of a transformed version of a data object A (106).

By way of another example, DCO 102 can associate a data object B (108) to a second data transformation function (TF2), which is different than the first data transformation function (TF1), to be used prior to compressing the data object B. In this example, the second transformation function (T2) can produce the transformed data object 110 by effectively computing the difference between two versions of data object B (B1-B2) as $\Delta i$ along with common data (data C). The difference ($\Delta i$) and common data (data C) can be compressing instead of compressing each one of the two versions of data object B (B1-B2) in its original form. A third data transformation (not shown) can be a null function (i.e., no transformation) and a fourth data transformation (not shown) may be designated for transformation in yet another way, and so on.

It should be noted that one or more transformation functions (e.g., TF1, TF2) can, for example, include a set of transformation functions to be used in connection with compression of a data object (e.g., a data object A, a data object B) and/decompression of a compressed version of the data object.

Figure 1B:
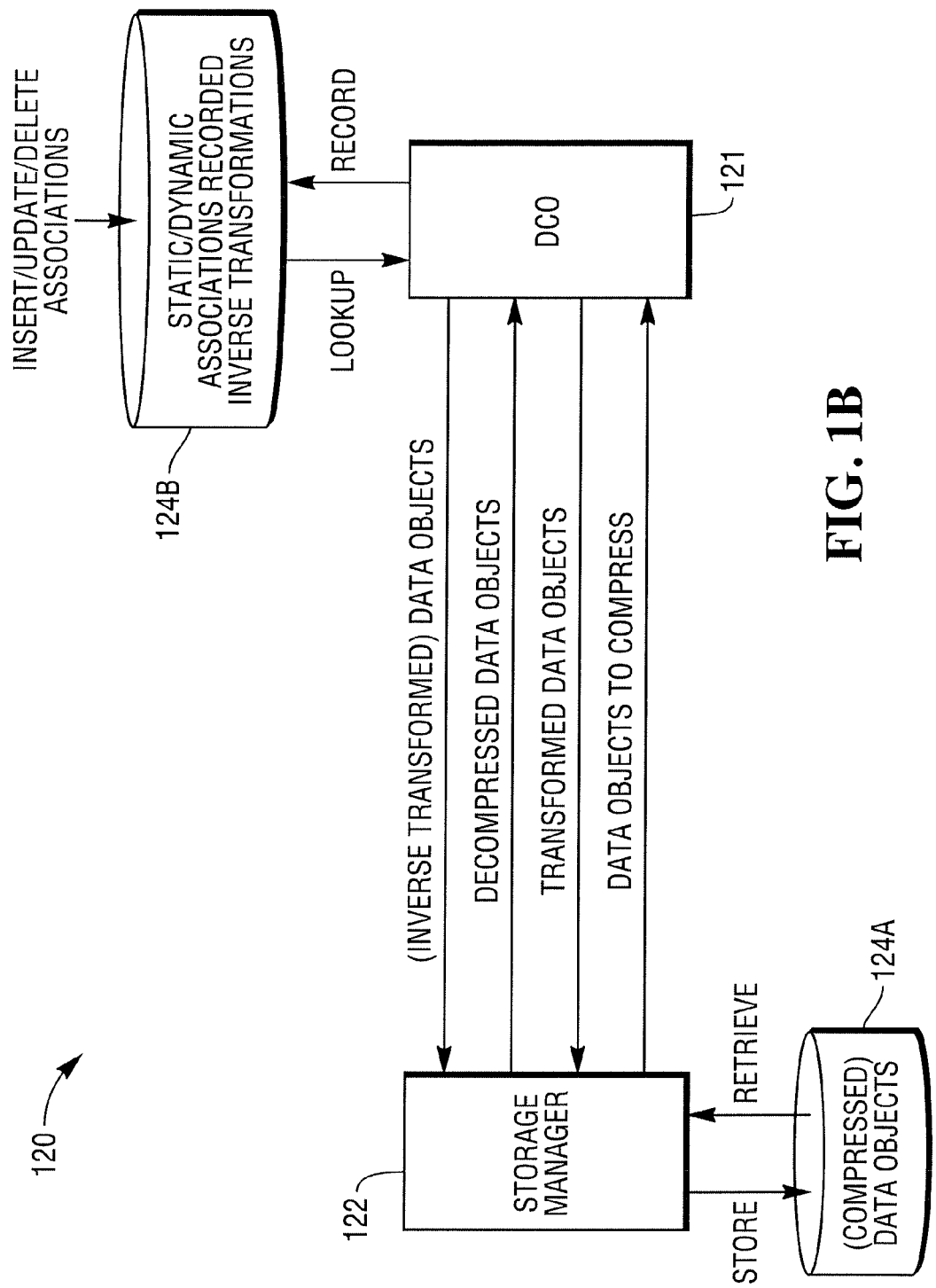
FIG. 1B depicts an extensible DCO in accordance with another embodiment of the invention.

FIG. 1B depicts an extensible DCO 121 in accordance with another embodiment of the invention. Referring to FIG. 1B, DCO 110 can be provided in context of data storage and/or analysis computing environment and/or system 120 that also includes a storage manager 122 and one or more storage 124. DCO 121 can access a storage (e.g., a catalog) 124B where associations between data (e.g., data objects), transformations functions and compression/decompression techniques can be stored. These associations can include static and dynamic associations that can be updated by the extensible DCO 121 to accommodate new data objects as well various transformations functions and compression/decompression techniques that may be used at a given time. The extensible DCO 121 can look up and record an association made between data (e.g., data objects), transformations functions and compression/decompression techniques. In addition, the extensible DCO 121 can provide the store manager with transformed data (e.g., transformed data objects). In doing so, the storage manager 122 can retrieve a data object S from a storage 124A and effectively request that the extensible DCO 121 determine whether it is to be transformed prior to being compressed. As such, the extensible DCO 121 can effectively determine or obtain an existing transformation function from the storage 124B and use it to transform the data object S and provide it to the storage manager 122 for compression using an associated compression technique that can be identified by the extensible DCO 121. The compressed version of the transformed data object S can be stored in the storage 124A by the storage manger 122 and later retrieved and decompressed and provided to the extensible DCO 121 for an inverse transformation function to obtain the original data object S.

FIG. 1C depicts a method 130 for facilitating compression and decompression in accordance with one embodiment of the invention. Method 130 can, for example, be used by the extensible DCO 12 in a data storage and/or analysis computing environment and/or system 120 (shown in FIG. 1B). Referring to FIG. 1C, initially, it can be determined (132) whether to store a data object in a compressed form. As a result, it can be determined (134) whether there is an associated transformation function and compression technique for the data object. Consequently, an associated transformation function can be applied (136). In addition, an association between the data object or the data object identifier (id) and the transformation function can be recorded (138) before the resulting data object is returned (140). On the other hand, if it is determined (132) that a data object is not to be stored in a compressed form, it is determined (133) whether a decompressed data object is to be obtained. As a result, it can be determined (135) whether there is an associated inverse transformation and an associated inverse transformation function for the object can be obtained and applied (137) before the resulting data object is returned (140).

Figure 1D:
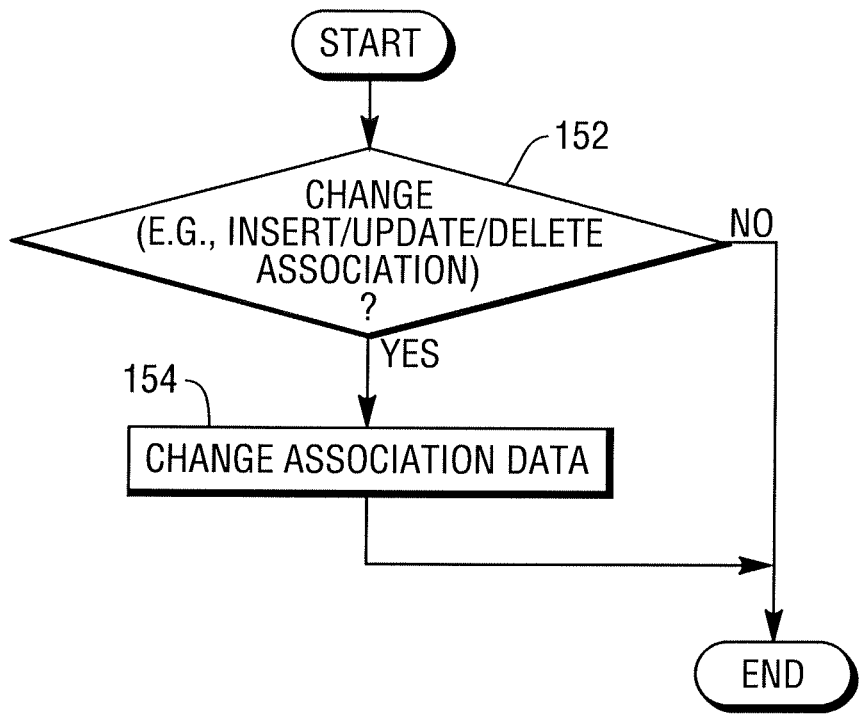
FIG. 1D depicts a method 150 for maintaining an extensible data compression and decompression system in accordance with one embodiment of the invention.

FIG. 1D depicts a method 150 for maintaining an extensible data compression and decompression system in accordance with one embodiment of the invention. Method 150 can, for example, be used by the DCO 121 of FIG. 1B.

Referring to FIG. 1D, it can be determined (152) whether to change the association data (e.g., insert a new association, update or delete an existing association). If it is determined (152) to change the association data, association data can be changed, for example, by inserting a new association, updating or deleting an existing association.

FIG. 1E shows pseudo code for determining, retrieving or looking up an association in accordance with one embodiment of the invention. It should be noted that an association between a data object and a transformation technique can be made in various ways, including, for example, a specific static association, a general (or type) static association and a dynamic association. In a specific static association, for example, a specific data object can be associated to a transformation technique in a predetermined or static manner. Whereas, in a general (or type) static association, for example, an object type, class, or category can be associated to a transformation technique in a predetermined or static manner. However, in a dynamic association, an association can be determined, for example, as needed or on the fly where a data object is to be compressed. This can be accomplished, for example, by sampling or examining an object. Referring to FIG. 1E, the pseudo code for function receive (DO, CM) illustrates lookup association for an data object (DO) and a Compression technique or method (CM) where transformation and inverse transformation functions (TF, ITF) can be obtained. It should be noted that in case a dynamic association a dynamic transformation function or method (DDTM) can be used to examine a data object in order to dynamically determine a transformation function for the data object.

FIG. 1F shows pseudo code for an exemplary dynamic transformation function for examining a data object in accordance with one embodiment of the invention. Specifically, the pseudo code shown in FIG. 1F can look for a monotonically increasing data object represented as a N×M matrix. As suggested by FIG. 1G, a data object can be sampled by examining only a number of N×M sized blocks in accordance with one embodiment of the invention.

Figure 1H:
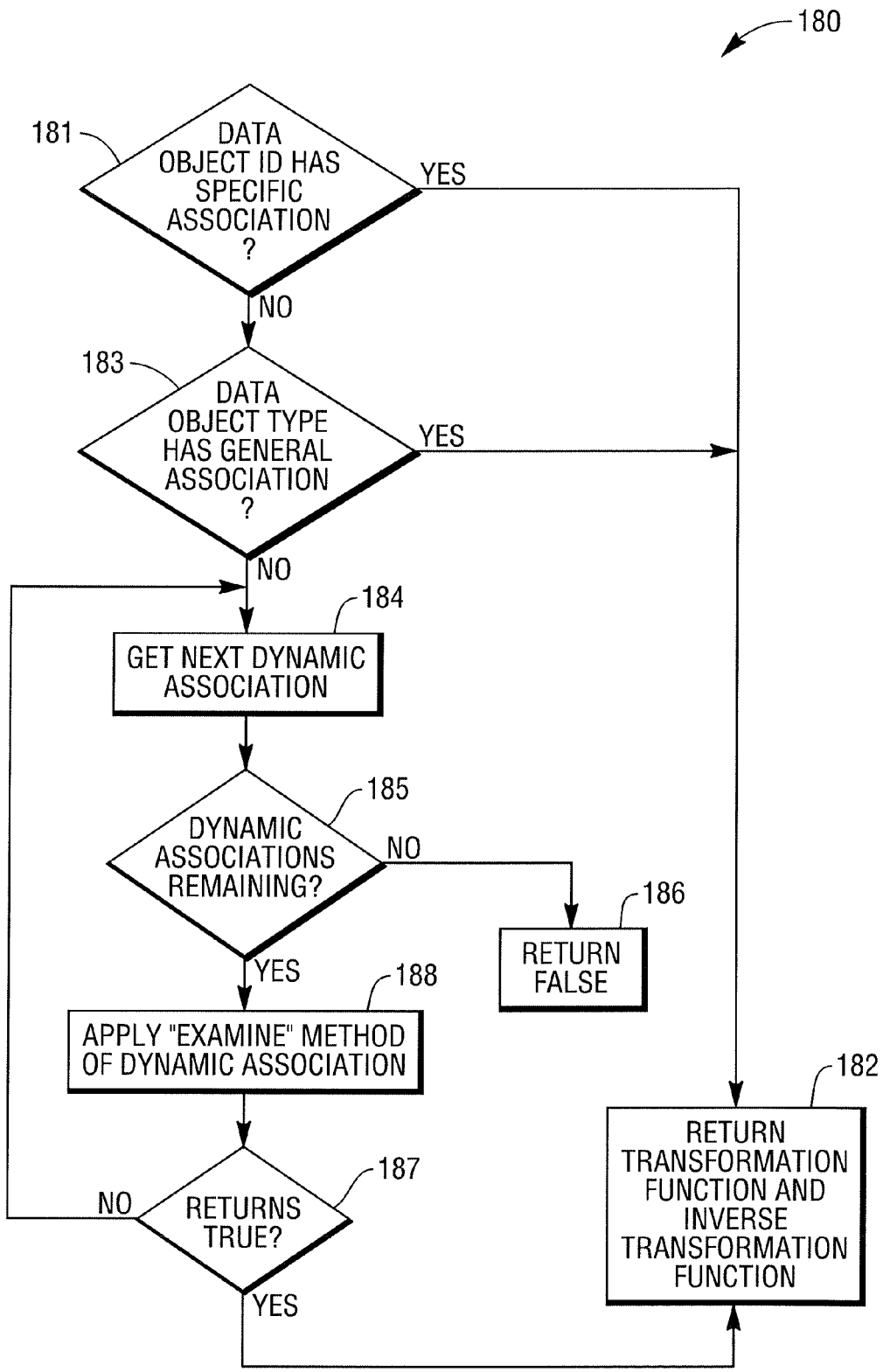
FIG. 1H depicts a method 180 for determining a specific or a dynamic association of a data object and compression method with a transformation function in accordance with one embodiment of the invention.

FIG. 1H depicts a method 180 for determining a specific or a dynamic association of a data object and compression method with a transformation function in accordance with one embodiment of the invention. Referring to FIG. 1H, it can be determined (181) whether there is a specific association for a data object. As a result, a transformation function and an inverse transformation function that are specifically associated with a data object can be returned (182). However, if it is determined (181) that there is no specific association for the data object, it can be determined (183) whether there is a general association. As a result, a transformation function and an inverse transformation function that are or can be general associated with the data object can be returned (182). On the other hand, if it is determined (183) that there is no general association for the data object, the method 180 can proceed to get (184) to a next dynamic association. Thereafter, it can be determined (185) whether a dynamic association remains for consideration or examination. If it is determined (185) that no dynamic association remains, false can be returned (186) before the method 180 ends. However, if it is determined (185) that a dynamic association remains, an "examine" (or examination) method can be applied (188) to determine an association (or dynamic association) in a dynamic manner. Consequently, if the "examine" method can return true (187) and a transformation function and inverse transformation function dynamically determined can be returned (182). However, if the "examine" method returns (187) false, the next dynamic association can be obtained (184) and the method 180 can proceed in a similar manner as discussed above to apply another "examine" method.

FIG. 1I depicts an exemplary function that can be used to determine if a data object with no specific association is a candidate for a dynamically-associated M×N matrix transpose transformation function in accordance with one embodiment of the invention. This determination can be made by sampling the data blocks making up the data object, and checking that each block contains values in increasing order.

Figure 2:
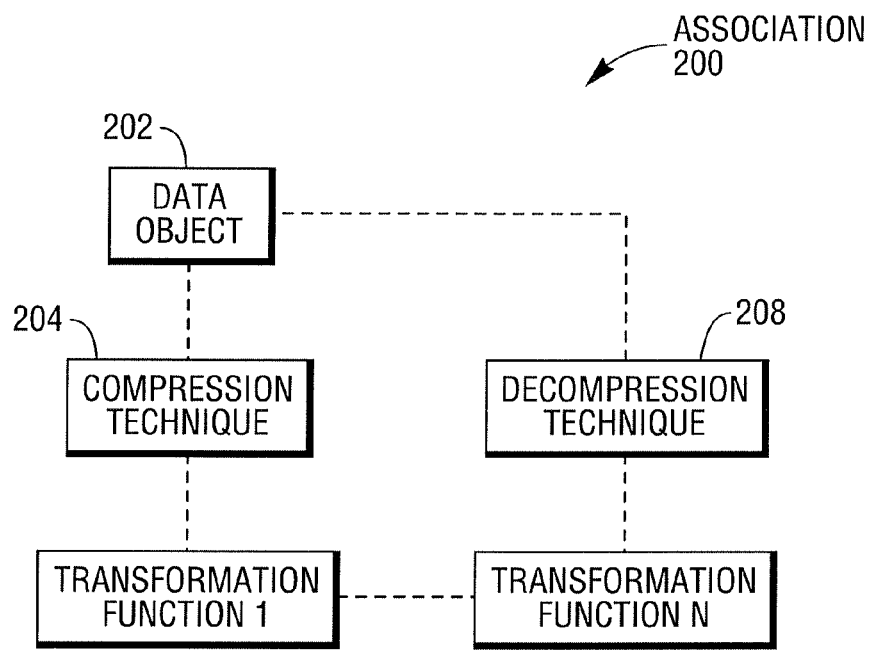
FIG. 2 depicts an association that can be made for a data object in connection with compression and decompression of the data object in accordance with one embodiment of the invention.

To further elaborate, FIG. 2 depicts an association 200 that can be made for a data object in connection with compression and decompression of the data object in accordance with one embodiment of the invention. The association 200 can, for example, be used by the DCO 102 depicted in FIG. 1A.

Referring to FIG. 2, an association 200 can be made between a data object 202, a compression technique 204 and a first transformation function 206A. As such, the first transformation function 206A can be designated to be used in connection with the compression technique 204 (e.g., prior to compression) in order to compress the data object 202 to obtain a compressed version of the data object 202.

In addition, in the association 200, the data object 202 can also be associated with a decompression technique 208 and a second transformation function 206B. As such, the second transformation function 206B can be designated to be used in connection with the decompression technique 208 in order to decompress a compressed version of the data object 202 that can be obtained by using the compression technique 204 in connection with the first transformation function 206A.

It should be noted that at least in some cases the first and second transformation functions (206A and 206B) can also be related and/or have a relationship with each other (e.g., be the mirror and/or inverse of each other). To give an example, FIG. 3 depicts a process 301 of compression and decompression of a data object 300 using related transposing functions in accordance with one embodiment of the invention.

Figure 3:
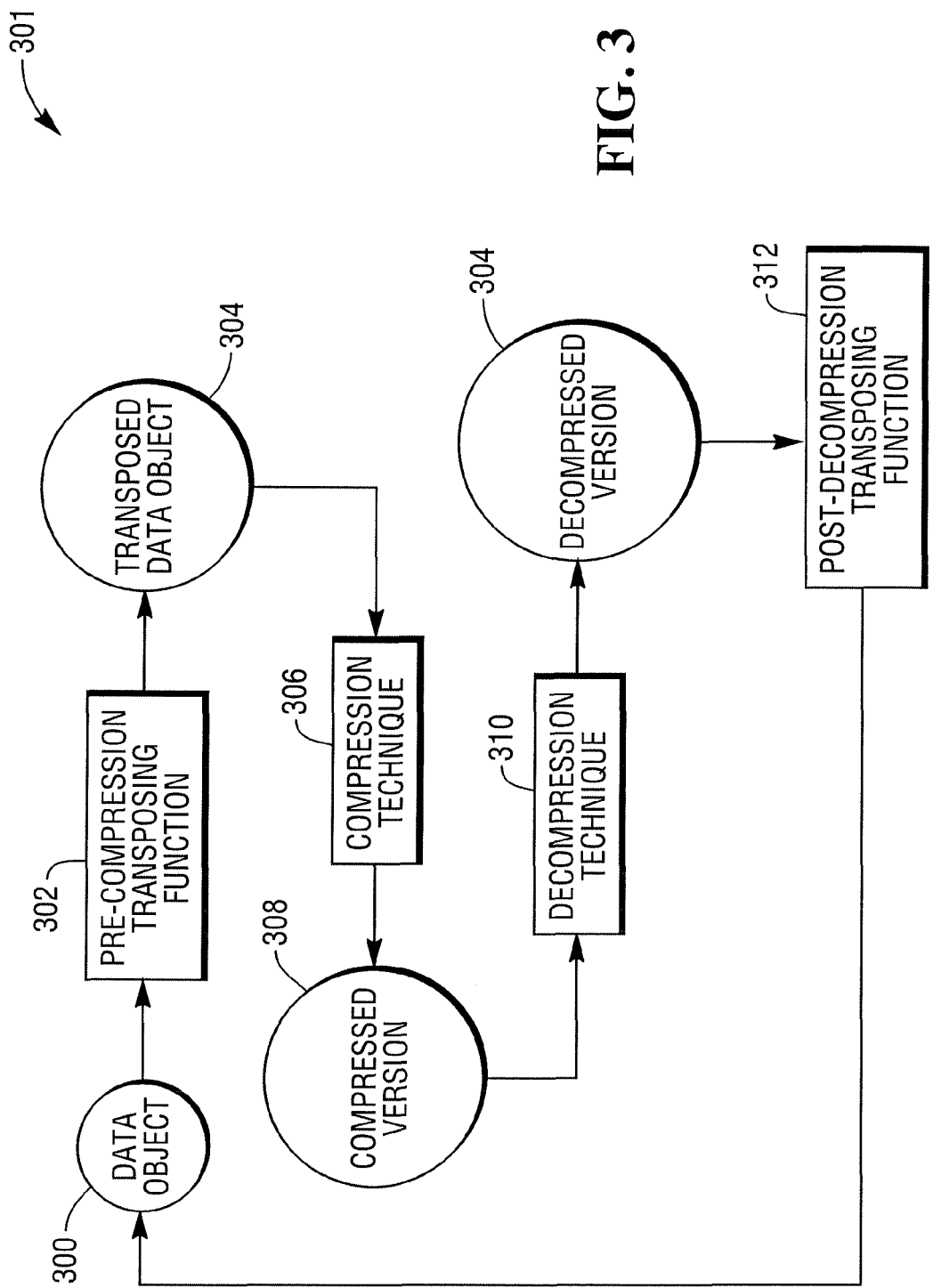
FIG. 3 depicts a process of compression and decompression of a data object using related transposing functions in accordance with one embodiment of the invention.

Referring to FIG. 3, prior to using a decompression technique (or function) to compress a data object 300, a pre-compression transposing function 302 is used to obtain a transposed version 304 of the data object 300. The transposed version 304 of the data object 300 is then compressed using a compression technique 306 to obtain a compressed version 308 of the transposed version 308 of the data object 300.

It should be noted that the compressed version 308 of the transposed data object 304 can take less space to store than a compressed version of the original data object 300 would take to store. To obtain the original data object 300, initially, the compressed version 308 of the transposed version 304 of the data object 300 can be decompressed using a decompression technique 310 that is suitable for decompression of data compressed by the compression technique 306, namely, by using a decompression technique 310 to obtain the decompressed data which is the transposed version 304 of the data object 300. Then, a second transposing function 312 can be used as a post-decompression transposing function 312 to obtain the original data object 300. The second transposing function 312 can, for example, be a function that is the inverse (or mirror) of the first transposing function 302 which was used as a pre-compression transposing function).

Figure 4:
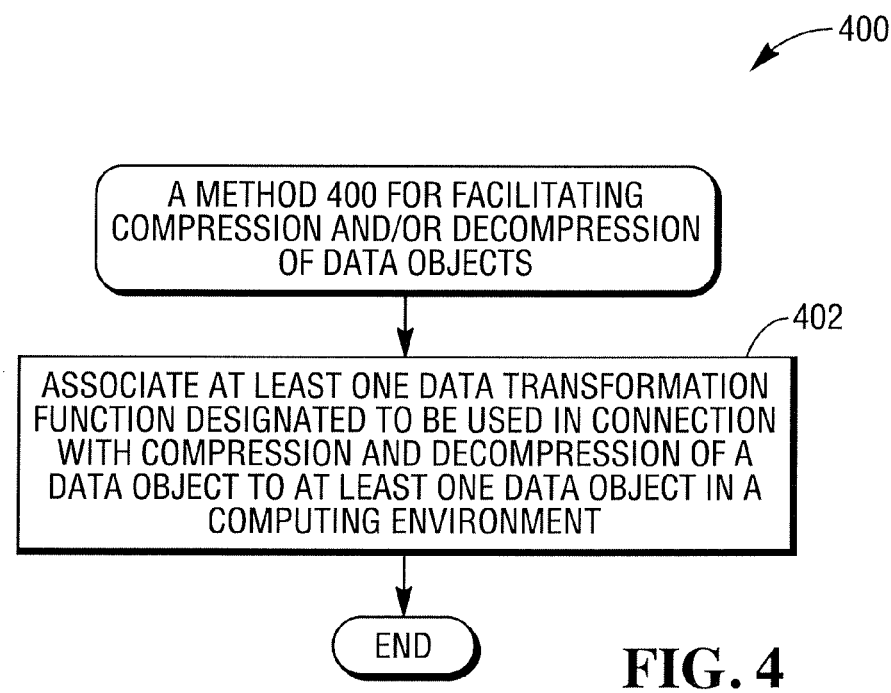
FIG. 4 depicts a method for facilitating compression and/or decompression of data objects in accordance with one embodiment of the invention.

FIG. 4 depicts a method 400 for facilitating compression and/or decompression of data objects in accordance with one embodiment of the invention. The method 400 can, for example, be used by the DCO 102 depicted in FIG. 1A. Essentially, method 400 can operate to associate at least one data transformation function to at least one data object associated with a computing environment or system. The data transformation function can be designated to transform the at least one data object from a first form received as input to a second form as output. The at least one data transformation function can be designated to be applied to the at least one data object in connection with application of one or more compression techniques designated to compress the at least one data object and (ii) one or more decompression techniques designated to decompress a compressed version of the at least one data object.

Figure 5:
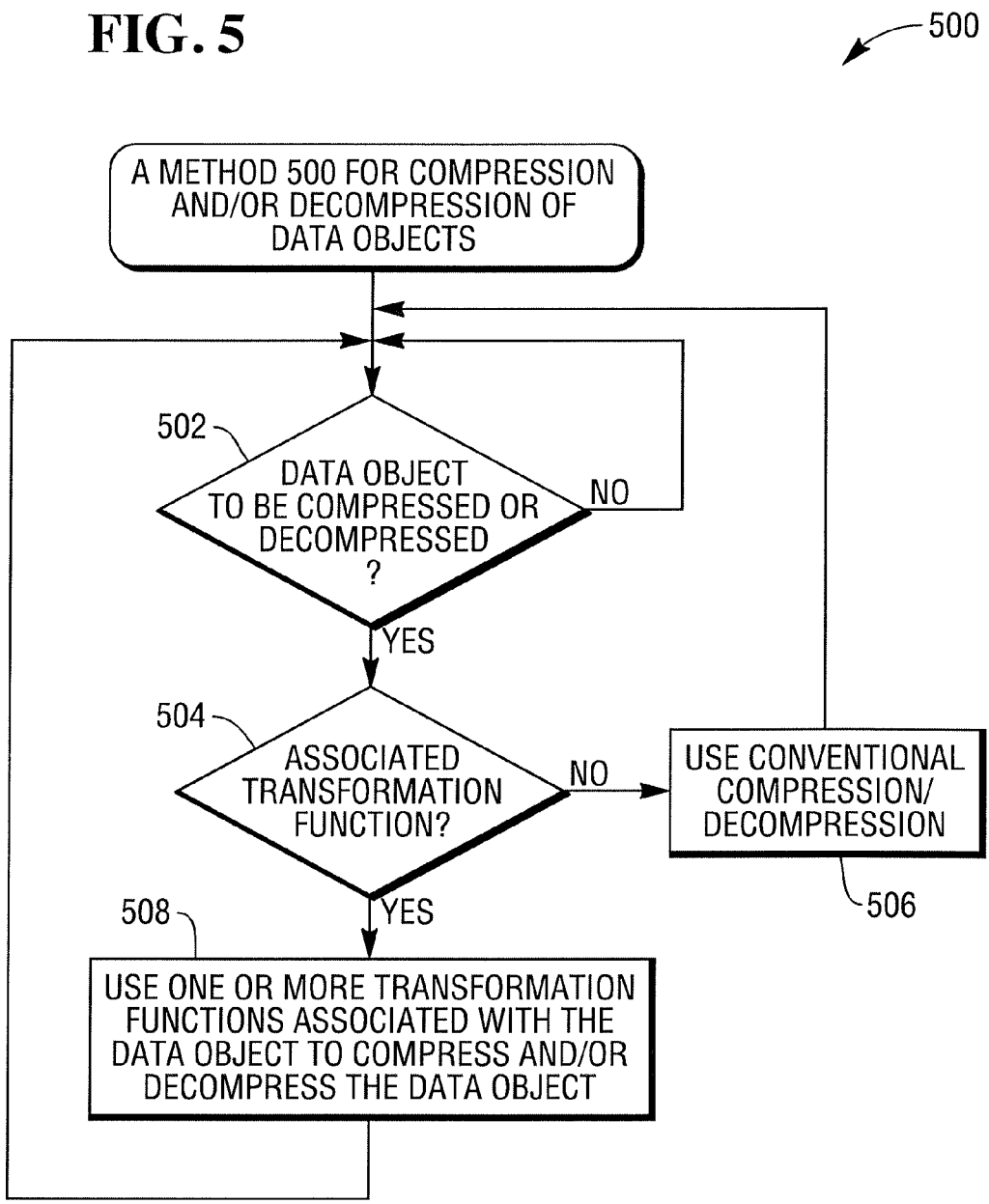
FIG. 5 depicts a method for compression and/or decompression of data objects in accordance with one embodiment of the invention.

FIG. 5 depicts a method 500 for compression and/or decompression of data objects in accordance with one embodiment of the invention. The method 500 can, for example, be used by the DCO 102 depicted in FIG. 1A. Referring to FIG. 5, in effect, method 500 waits for a determination (502) that a data object is to be compressed or decompressed. If it is determined (502) that data object is to be compressed or decompressed, it is determined (504) whether a transformation function has been associated with compression or decompression of the data object.

If it is determined (504) that no transformation function has been associated with compression or decompression of the data object, the data object can be compressed and/or decompressed in a conventional manner (506). However, if it is determined (504) that at least one transformation function has been associated with compression or decompression of the data object, one or more transformation functions can be applied (508) in connection with compression and/or decompression of the data object. Thereafter, the method 500 can proceed to determine whether another data object is to be compressed or decompressed in a similar manner as discussed above to compress and/or decompress another data object.

Figure 6:
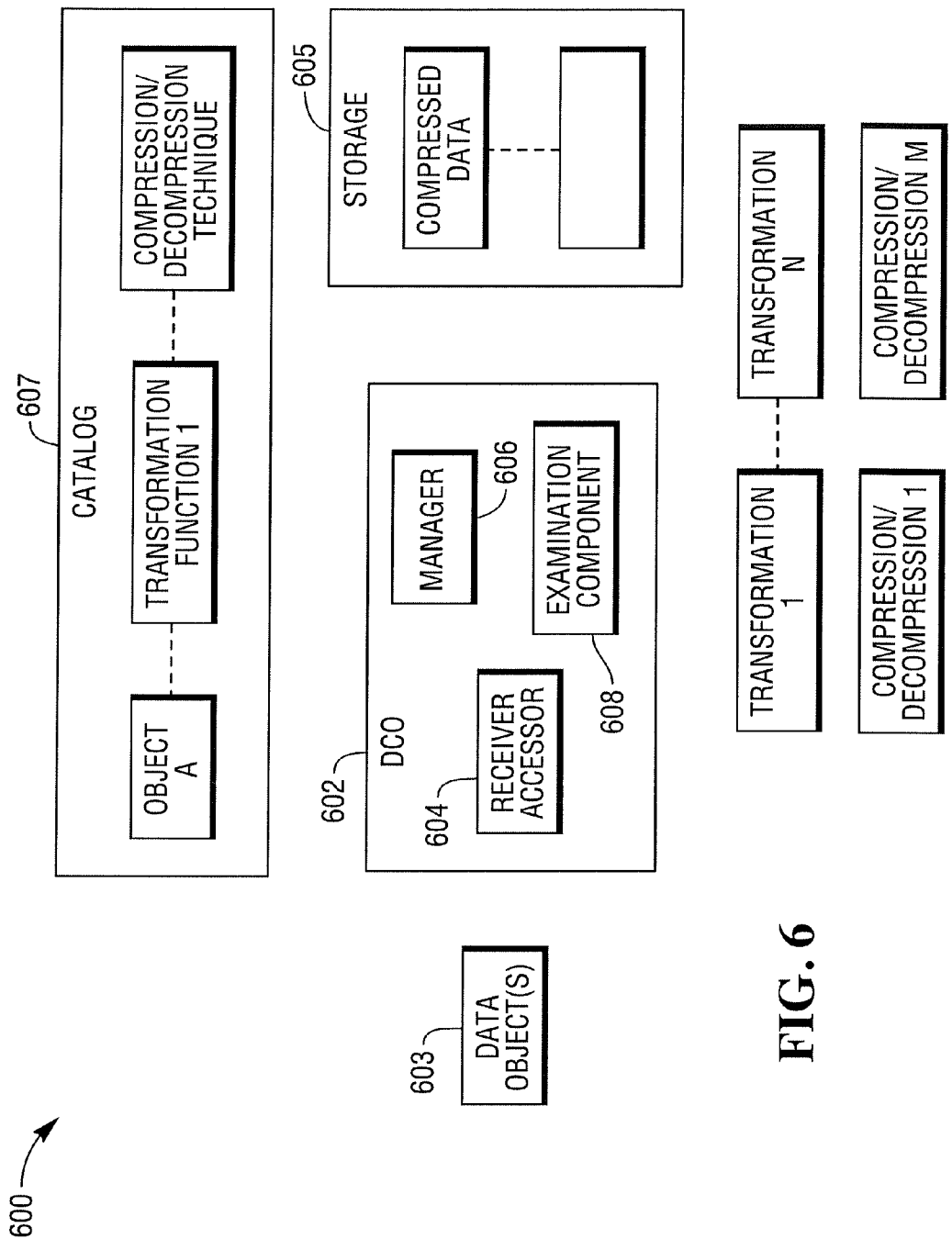
FIG. 6 depicts a DCO in a computing environment in accordance with another embodiment of the invention.

FIG. 6 depicts a DCO 602 in a computing environment 600 in accordance with another embodiment of the invention. DCO 602 can represent one or more components that can, for example, be provided for the DCO 202 depicted in FIG. 1A. Although not shown in FIG. 6, similar to DCO 102 shown in FIG. 1A, DCO 602 can, for example, be implemented using one or more software components (e.g., one or more executable code modules or functions) and one or more hardware components (a processor and memory).

Referring to FIG. 6, the DCO 602 can include a receiver/access component 604 operable to receive one or more data objects 603 for processing. The receiver/access component 604 can also access data in storage 605 and in a catalog 607. Of course, one or more data objects 603 and the catalog 505 may also be stored in the storage 605 even though depicted as separate components in FIG. 6.

In any case, a data object 603 can be obtained by the receiver/access component 604 for processing. Typically, it is desirable to store the data object 603 in a compressed from. In doing so, a manager component 606 of the DCO 602 can determine whether the data object 606 has been associated with a transformation function or a compression technique by checking the catalog 607 to determine whether such already exists or one can be readily determined based on existing data in the catalog, for example, based on type or class of the data object 607. By way of example, the manager component 606 can determine that an association already exists in the catalog 607, or request that an examination component 608 determine whether the data object 603 belongs to a class or type of data that has been associated with a transformation function and a compression technique, and so on. In case a determination cannot be readily made by the manager component 606 (e.g., a new type or unrecognized form of a data object is encountered), the examination component 608 can examine the data object 603 to determine one or more characteristics (e.g., monotonically increasing data, a data set with similar versions) that can, in turn, be used to find a suitable transformation function and/or compression technique. For example, given a particular compression technique, the examination component 608 can effectively look or search for one or more determined characteristics that would make application of a pre-compression transformation technique (e.g., transposing data to form with longer patterns of data) more desirable. As such, in some cases, transformation in connection with a particular compression technique or any compression technique may not be deemed very useful. As a result, a data object 603 may not be associated with a transformation function in the catalog 607 and consequently compressed in its original form.

Furthermore, in some cases, the manager 606 may effectively forego an examination process, or supplement an examination process with inconclusive results, by initiating a trail (or test) process by which of one or more transformation functions can be applied to the data object 603 in connection with one or more compression techniques. The result(s) can be compared with compressed versions of the original form of data object 603 in order to select a transformation function or determine whether or not to use a transformation function at all in connection with compression of the data object 603 in its present form.

Referring to FIG. 6 again, it should be noted that a data object 603 can be associated with, or designated to be transformed by one or more transformation functions 1-N in connection with one or more compression/decompression techniques 1-M. Also, a compressed version of the data object 603, which may be obtained with or without transformation, can be stored in the storage 605. A compressed version of the data object 603 can be decompressed and transformed back to its original form in connection with one or more compression/decompression techniques 1-M and one or more of transformation functions 1-N.

It will also be appreciated that DCO 602 can achieve compression of data objects in a dynamic manner and at execution time (or run time) when, for example, a system is active and processing data. In doing so, associations between one or more data objects 603 and various transformation functions and/or compression/decompression techniques can change over time, new associations can be made, and additional transformation functions and/or decompression techniques can be utilized in an extendible or extensible system in a dynamic manner. By way of example, a data object 603 can be reexamined by the examination component 608 when data associated with the data object 603 is modified and/or from time to time (e.g., periodically) to determine whether to associate or assign the data object 603 to a different transformation function and/or compression/decompression technique, or whether a new association to a transformation function is to be made for a data object 603 even though it had previously been determined not to use a transformation function in connection with compression/decompression of the data object 603. As such, the DCO 602 can accommodate and adjust to changes in a system in a dynamic manner in order to determine an effective or a more effective approach to compression of a particular data object 603 in its present form and as additional compression and/or transformation functions may become available. The operations associated with determining a suitable transformation function and/or compression/decompression technique can, for example, be performed, when data is to be compressed or decompressed, or as background processes executed when there is relatively less need for system resources for performing more primarily functions.

Figure 7:
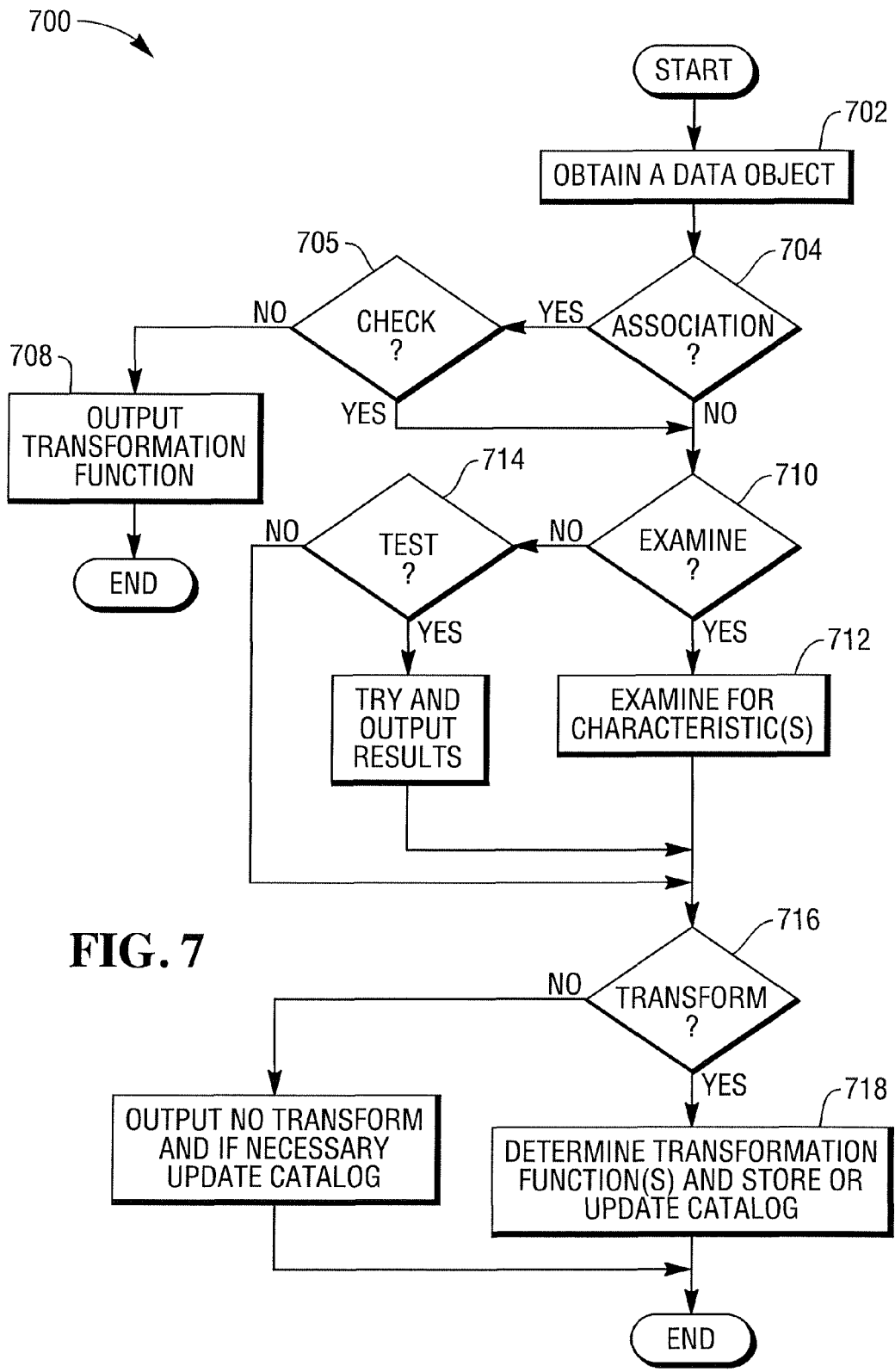
FIG. 7 depicts a method for facilitating compression and/or decompression of data objects in accordance with one embodiment of the invention.

To further elaborate, FIG. 7 depicts a method 700 for facilitating compression and/or decompression of data objects in accordance with one embodiment of the invention. Method 700 can, for example, be performed by the DCO 602 depicted in FIG. 6.

Referring to FIG. 7, initially, a data object is obtained (702) for processing. Next, it is determined (704) where the data object has been already associated with a transformation function or one can be readily determined for the object. If it is determined (704) that the data object has been already associated with a transformation function, it can still be determined (706) whether to validate, check or reexamine the association before a transformation function is identified and output (708) based on an existing association and the method 700 ends.

However, if it is determined (704) that there the object is not currently associated with a transformation function or if it is determined (706) to examiner or reexamine an existing or a potential association with a transformation function, it can determined (710) whether to examine the data object to detect one or more characteristics. Accordingly, the data object can be examined (712) to detect one or more characteristics that would render it more suitable for transformation by a transformation function rather than compressing the data object in its original form. The result of the examination can be provided to a determination (716) where a decision can be made as to whether a transformation function is to be used or not.

Alternatively, if it is determined (710) not to examine the data object, it can be determined (712) whether to initiate a trial (or testing) process by which one or more transformation functions can be tested in connection with one or more compression/decompression techniques. As a result, the data object can be transformed (714) using one or more transformation functions and its original form and the resulting compressed version can be provided as results of the trial process to the determination (716) where a decision can be made as to whether a transformation function is to be used or not.

As a result of the determination (716), a transformation function can be identified and associated (718) with the data object. This association can be also be stored (718) as a new association or by updating an existing association between the data object, at least one transformation function and at least one compression/decompression technique before the method 700. As a result, a catalog of association may be updated to reflect a change in compression of a data object going forward. It should be noted that a data object can be associated with multiple transformation functions such that each one of the transformation functions may be designated for use in connection with a particular compression technique. Also, an optimal combination of a transformation function and a compression technique may also be identified and used accordingly.

On the other hand, if the determination (716) determines not to use a transformation in connection with compression of the data object, an indication can be output (720) before the method 700 ends. It should be noted that this indication can also serve to facilitate a change to an existing association if there is a need to do so. As a result, a catalog of association may be updated to reflect a change in compression of a data object going forward.

Figure 8:
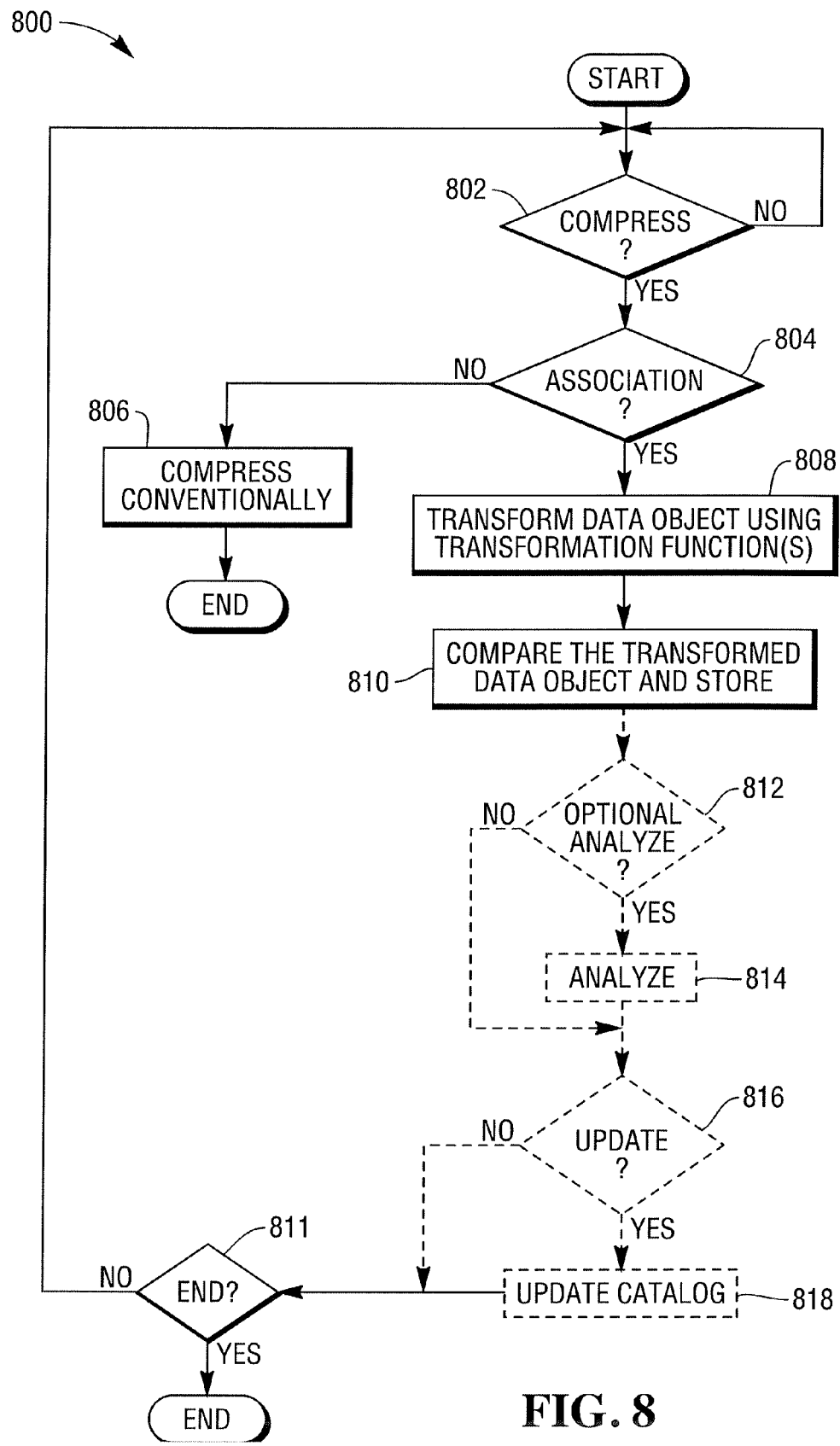
FIG. 8 depicts a method for compressing data objects in accordance with one embodiment of the invention.

To elaborate still further, FIG. 8 depicts a method 800 for compressing data objects in accordance with one embodiment of the invention. Method 800 can, for example, be performed by the DCO 602 depicted in FIG. 6.

Referring to FIG. 8, in effect, method 800 can wait for a determination (802) of whether to compress a data object. If it determined (802) to compress a data object, it can be determined (804) whether the data object is associated with a transformation function. If it is determined (804) that data object is not associated with a transformation function, convention data compression can be performed (806) before the method 800 ends.

However, if it is determined (804) that the data object is associated with a transformation function, at least one transformation function is used to transform (808) the data object to obtain at least one transformed version of the data object. It should be noted that a transformation function that is generally suited for compression of a data object, or one that is specifically suited for a particular compression technique can be identified and used. In any case, at least one transformed version of the data object can be compressed using at least one compressed technique and stored (810). Thereafter, the method 800 can end (811) or continue to wait to compress additional data objects. Method 800 can, for example, end as a result of system shutdown or input provided to the system.

Optionally, however, it can be determined (812) whether to analyze the compressed version. Accordingly, the compressed version can be analyzed (814), for example, by compared it with data (e.g., length of compressed data) regarding one or more other compressed versions of the same data object, including a compressed version obtained or expected to be obtained without using a transformation function associated with the data object. This analysis can, for example, be made in a similar manner as that described in method 800 depicted in FIG. 8. As a result of the analysis (814), it can be determined (816) whether to update the association and the association can be updated (818) accordingly. Consequently, a different transformation function or no transformation function can be used to compress the data object either immediately or next time there is a need to compress the data object. Thereafter, the method 800 can end (811) or continue to wait to compress additional data objects.

In view of the compression method 800, it will readily be apparent that a decompression method can also be provided to decompress compressed version of data object in a similar manner in accordance with one or more embodiment of the invention. However, unlike the compression method 800 where a transformation function is applied before applying a compression technique, transformation functions can be applied after decompression of compressed data in order to obtain data objects in their original form.

An Example of Compression of Data in a Database Environment

In view of the foregoing, it will be apparent that the results of a compression technique on a data object (or a data set) can be improved by performing a transformation on the data object prior to applying a compression technique in order to transform the data to a form that may be more suitable for the compression technique. For example, a pre-compression transformation can be used to at least significantly if not dramatically improve compression results for "columnar offset" data structures used to implement "columnar tables" in various database systems and environments.

By way of background and as those skilled in the art will readily appreciate, columnar tables can store values of each individual column in a separate "columnar data file." In this context, each value in a columnar data file can be stored in the same "row insertion" order. Also, direct access to the values of each column corresponding to a particular row can be achieved using simple array arithmetic to determine the page and offset of the value. Direct access to a fixed length column value (e.g. integer, dates) can require access to only the columnar data file. However, direct access to column values for variable length data types (e.g., varchar, numeric) can require first going through an associated columnar offset data structure. The column offset structure is a fixed length data structure that can, for example, store eight (8) byte references (page number and page offset) to the actual data values stored in the associated columnar data file. Retrieving a variable length data value can involve a first step wherein array arithmetic is used to find the reference to the data value stored in the columnar offset structure, and a second step wherein the reference is used to retrieve the corresponding data value from the associated columnar data file.

Figure 9:
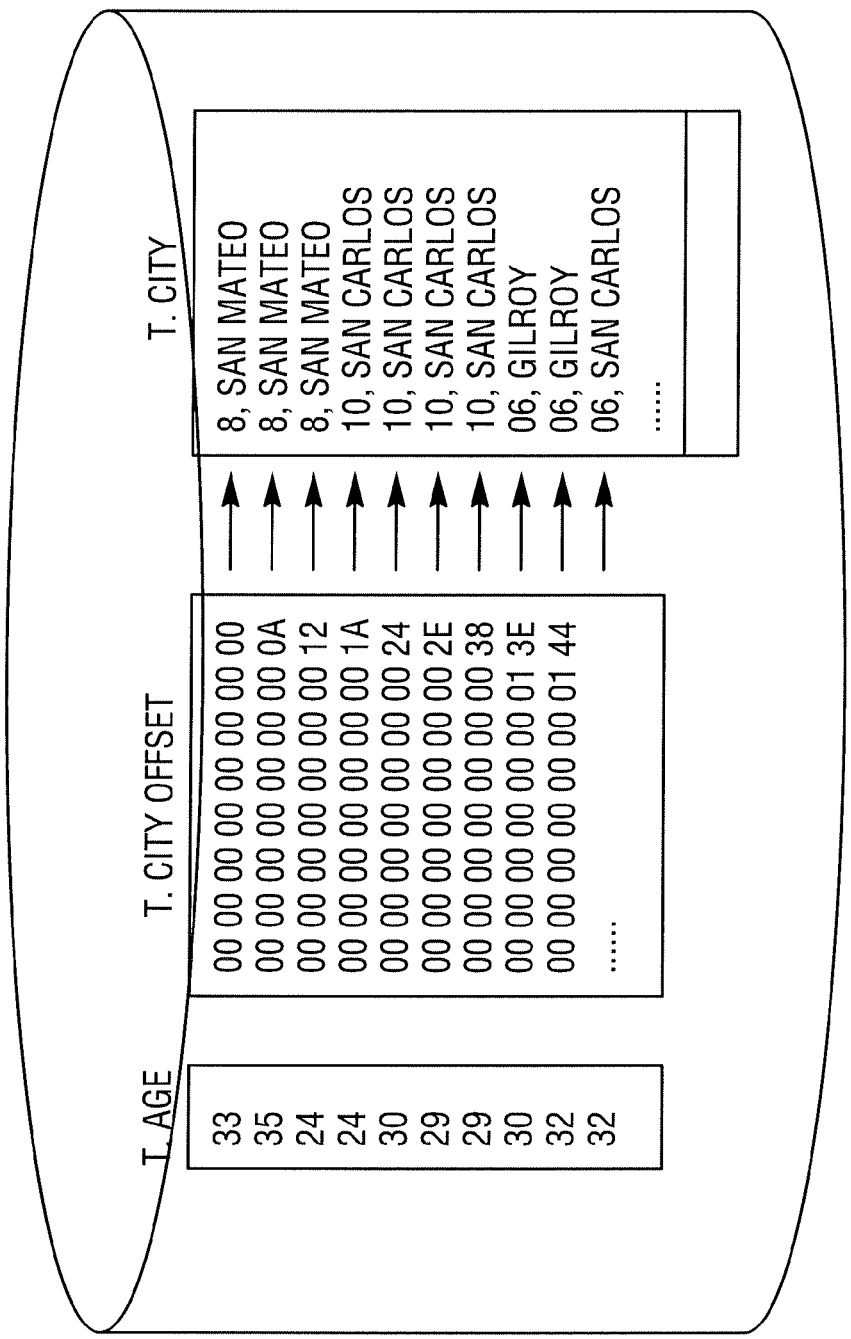
FIG. 9 illustrates the storage layout for a columnar table.

FIG. 9 illustrates the storage layout for a columnar table. The table stores data for a fixed length column "DEPT.DEPTNO" and for a variable length column "DEPT.CITY". Retrieving the "DEPT.CITY" value for the third ($3^{rd}$) row can require first performing an array access to the corresponding reference in the "DEPT.CITY OFFSET" structure. The retrieved reference can, for example, indicate that the corresponding string value "San Mateo" can be found in the corresponding "DEPT.CITY" columnar data file at page X'000000000000 and page offset X'00 12.

In the example, dictionary-based Lempel-Ziv (LZ) compression methods can be used to compress the row and/or column data stored in tables for a database. As those skilled in the art will readily appreciate, these compression methods can use a limited size dictionary structure (input for LZ77 and explicit dictionary for LZ78) to search for common bit patterns that can be substituted with a smaller reference to a previously seen pattern. A larger dictionary may improve compression ratios because it increases the likelihood that common data values will be observed. However, a larger dictionary typically comes with the cost of increased memory usage and decreased compression speed. Individual columnar data files typically compress well using existing LZ compression techniques because the values of a particular column all come from the same domain. Consequently, individual data values, or characters within a data value, are often repeated in close memory proximity. Columnar offset files, however, do not compress as well with LZ because the values are from a custom numeric domain and there is little duplication of individual data values.

It will be appreciated that compression results can be improved dramatically by first transforming the columnar offset data storage prior to applying LZ. Referring again to FIG. 9, note that the columnar offset data structure stores a sequence of monotonically increasing eight (8) byte references (6 byte page numbers, 2 byte page offset) to values in the associated columnar data file (the values are represented in hex notation in the figure). Note that bits in higher order positions change less frequently. These higher order bits exhibit more repetition; however, they are not adjacent in storage and are hence less likely to be compressed by LZ compression. This situation can be remedied by applying a matrix transposition (transposing matrix) to the column offset storage in order to rearrange the layout so that repeated bytes are stored in close proximity.

To elaborate even further, FIG. 10 illustrates an example of a transposing function that can be used in a database environment in accordance with one embodiment of the invention. More specifically, FIG. 10 depicts the before and after effects of applying a tumbling, 16×8 byte matrix transposition to a columnar offset file. The transformation is applied on 128 byte (16×8) partitions of columnar offset storage at a time. Each partition is treated as a 16×8 byte matrix that is transposed into an 8×16 byte matrix. Referring again to FIG. 10, note that the higher order bytes in the columnar offset storage on the left are stored contiguously in the transposed storage on the right. These sections of transposed storage compress very well using general-purpose LZ compression methods.

The transformation depicted in FIG. 10 which can be used for a pre-compression transformations and its inverse transformation which can be used as a post-decompression transformations can be achieved using a single tumbling matrix transpose transformation function that can operate to achieve a desired pre-compression or post-decompression transposition.

FIG. 11 shows pseudo code for a tumbling matrix transpose transformation in accordance with one embodiment of the invention. The function takes as input the location of an output buffer ("outBuf"), the location ("in Buf") and length ("size") of the input buffer, as well as the number of rows ("numrows") and columns ("numcols") of the matrix. The tumbling partition size is the product of the "numrows" and "numcols" inputs. The transformation in the example of FIG. 11 would be achieved by calling this function with sixteen (16) and eight (8) for the "numrows" and "numcols" inputs, respectively.

An inverse of the tumbling matrix transpose transformation (noted above) can be applied to the columnar offset data after it retrieved from storage and decompressed. The inverse transformation for the example of FIG. 9 would simply call the function of FIG. 11 on the transposed storage, passing eight (8) and sixteen (16) for the "numrows" and "numcols" inputs, respectively. Generally, a transformation functions can have an inverse transformation function that can be applied after the decompression of a compressed version.

It should be noted that an associated transformation function cab be determined, for example, by examining an information repository and determining, based on the examination of the information repository, a dynamic association between a transformation function and the compression method, for example, by determining a data distribution method for the compression method that evaluates to true on the data object.

Multi-Node, Parallel Database Systems

The techniques of the invention can be useful for large database systems, including multi-node, parallel database systems partly because of the ever increasing need and desire to store more and more data in such systems. A multi-node parallel database system can, for example, use a massively parallel processing (MPP) architecture or system to perform various database operations in parallel.

To further elaborate, FIG. 12 depicts a database node $1105$ of a database system or Database Management System (DBMS) $1000$ in accordance with one embodiment of the invention. The database system $1000$ can, for example, be provided as a Teradata Active Data Warehousing System. It should be noted that FIG. 12 depicts an exemplary architecture for one database node $1105_1$ of the DBMS $1000$ in accordance with one embodiment of the invention. Referring to FIG. 6, the DBMS node $1105_1$ includes one or more processing modules $1110$-N connected by a network $1115$, that manage the storage and retrieval of data in data-storage facilities $1120_{1-N}$. Each of the processing modules $1110$-N can represent one or more physical processors or virtual processors, with one or more virtual processors (e.g., Access Module Processer (AMP)) running on one or more physical processors.

For the case in which one or more virtual processors are running on a single physical processor, the single physical processor swaps between the set of N virtual processors. For the case in which N virtual processors are running on an M-processor node, the node's operating system schedules the N virtual processors to run on its set of M physical processors. By way of example, if there are four (4) virtual processors and four (4) physical processors, then typically each virtual processor could run on its own physical processor. As such, assuming there are eight (8) virtual processors and four (4) physical processors, the operating system could schedule the eight (8) virtual processors against the four (4) physical processors, in which case swapping of the virtual processors could occur.

In the database system $1000$, each of the processing modules $1110_{1-N}$ can manage a portion of a database stored in a corresponding one of the data-storage facilities $1120_{1-N}$. Also, each of the data-storage facilities $1120_{1-N}$ can include one or more storage devices (e.g., disk drives). It should be noted that the DBMS $1000$ may include additional database nodes $1105_{2-O}$ in addition to the database node $1105_1$. The additional database nodes $1105_{2-O}$ are connected by extending the network $1115$. Data can be stored in one or more tables in the data-storage facilities $1120_{1-N}$. The rows $1125_{1-z}$ of the tables can be stored across multiple data-storage facilities $1120_{1-N}$ to ensure that workload is distributed evenly across the processing modules $1110_{1-N}$. A parsing engine $1130$ can organize the storage of data and the distribution of table rows $1125_{1-z}$ among the processing modules $1110_{1-N}$. The parsing engine $1130$ can also coordinate the retrieval of data from the data-storage facilities $1120_{1-N}$ in response to queries received, for example, from a user. The DBMS $1000$ usually receives queries and commands to build tables in a standard format, such as SQL.

In one implementation, the rows $1125_{1-z}$ are distributed across the data-storage facilities $1120_{1-N}$ by the parsing engine $1130$ in accordance with their primary index. The primary index defines the columns of the rows that are used for calculating a hash value. The function that produces the hash value from the values in the columns specified by the primary index is called the hash function. Some portion, possibly the entirety, of the hash value is designated a "hash bucket". The hash buckets are assigned to data-storage facilities $1120_{1-N}$ and associated processing modules $1110_{1-N}$ by a hash bucket map. The characteristics of the columns chosen for the primary index determine how evenly the rows are distributed.

Referring to FIG. 12, it should be noted that a Data Compression Optimizer (DCO) $1002$ can be provided for the database system $1000$ in accordance with one embodiment of the invention. It will be appreciated that the DCO $1002$ can be provided as a separate central entity (or component, or module) severing all of the database nodes $1105$ and/or it can at least partially be implemented, for example, in the database node $1105_1$ or another one the nodes $1105$ (not shown), or in one or more of the processing modules $1110_{1-N}$ of the database node $1105_i$ (not shown) or another one the nodes $1105$ (not shown). In any case, a DCO $1002$ can be used to at least facilitate compression/decompression of data objects in one or more database nodes or 1105$_i$ if not all of the data objects processed by the database system 1000.

The various aspects, features, embodiments or implementations of the invention described above can be used alone or in various combinations.

Implementations of the subject matter and the functional operations described in this specification can be implemented in digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter affecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CDROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, tactile or near-tactile input.

Implementations of the subject matter described in this specification can be implemented in a computing system that includes a backend component, e.g., as a data server, or that includes a middleware component, e.g., an application server, or that includes a frontend component, e.g., a client computer having a graphical user interface or a Web browser through which a user can interact with an implementation of the subject matter described is this specification, or any combination of one or more such backend, middleware, or frontend components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the disclosure or of what may be claimed, but rather as descriptions of features specific to particular implementations of the disclosure. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

The various aspects, features, embodiments or implementations of the invention described above can be used alone or in various combinations. The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A computer-implemented method, implemented at least partly on a device, for facilitating at least one of compression and decompression of data objects associated with a computing environment or system, the computer-implemented method comprising:
    associating, by the device, at least one data transformation function to at least one of the data objects, wherein the data transformation function is designated to transform the at least one data object from a first form received as input to a second form as output, wherein the data transformation function includes at least one tumbling transposing function, and wherein the at least one data transformation function is further designated to be applied to the at least one data object in connection with application of at least one of: (i) before one or more compression techniques designated to compress the at least one data object are applied, and (ii) after one or more decompression techniques designated to decompress a compressed version of the at least one data object are applied; and
    wherein the at least one data object is represented as one or more N×K byte sized partitions of monotonically increasing fixed-length values of size K, wherein N and K are positive integers greater than one;
    wherein the at least one data transformation function includes a tumbling N×K byte matrix transpose function that can be applied to the one or more N×K byte sized partitions;
    wherein the at least one data transformation function also includes a tumbling K×N byte matrix transpose function as the inverse function of the tumbling N×K byte matrix transpose function;
    wherein the tumbling N×K byte matrix transpose function is designated to be used with a dictionary-based compression technique, and
    wherein the K×N byte matrix transpose function is designated to be used with a dictionary-based decompression technique.

2. The computer-implemented method of claim 1,
    wherein the at least one data transformation function includes a pre-compression transformation function designated to be applied to the at least one data object to obtain at least one transformed data object before the at least one transformed data object is compressed to obtain at least one compressed version of the at least one data object, and
    wherein the computer-implemented method further comprises:
    associating the at least one pre-compression transformation function that modifies the arrangement of the data for the compression of the data and prior to the compression of the data, to the at least one data object and a compression technique designated to compress the at least one transformed data object to obtain at least one compressed version of the at least one data object.

3. The computer-implemented method of claim 2,
    wherein the at least one data transformation function includes a post-decompression transformation function designated to be applied to a decompressed version of the at least one compressed version of the at least one data object; and
    wherein the computer-implemented method further comprises:
    associating the post-decompression transformation function to the at least one data object and a decompression technique designated to decompress the at least one compressed version of the at least one data object to obtain at least one decompressed version of the at least one data object before the post-decompression transformation function is applied to the at least one decompressed version to obtain the at least one data object.

4. The computer-implemented method of claim 1, wherein the computer-implemented method further comprises:
    associating the at least one data object and the at least data transformation function also to at least one of: (a) a compression technique to be applied to the at least one database object and (b) a decompression technique to be applied to a compressed version of the at least one database object.

5. The computer-implemented method of claim 1, wherein the computer-implemented method further comprises:
    receiving at least one of: (i) at least one data object (ii) a compression technique, and (iii) a decompression technique; and
    determining the least one transformation function for at least one of: (i) the at least one data object (ii) the compression technique, and (iii) the decompression technique.

6. The computer-implemented method of claim 1, wherein the computer-implemented method further comprises:
    receiving a first data object of the data objects and a compression technique to be applied to the first data object to compress the first data object; and
    determining, based on one or more characteristics of the first data object, a transformation function to be applied to the first data object prior to using the compression technique to compress the first data object.

7. The computer-implemented method of claim 6, wherein the computer-implemented further comprises:
    examining the first data object to determine the one or more characteristics of the first data object.

8. The computer-implemented method of claim 1, wherein the at least one data object includes one or more of the following:
a data portion or segment, a class or type of data, and a field.

9. The computer-implemented method of claim 1, wherein the data transformation function is a transposing function.

10. The computer-implemented method of claim 1, wherein K is eight (8) or a multiple of eight (8), and wherein N is thirty two (32) Kilo Bytes (KB) or a multiple of 32 KB.

11. The computer-implemented method of claim 10, wherein the compression and decompression techniques are based on LZ77, LZ78 technique.

12. The computer-implemented method of claim 11, wherein the at least one data object includes a columnar offset for a database.

13. The computer-implemented method of claim 1, wherein the associating associates a first database object of the data objects to a first transformation function and also associates a second database object of the data objects, different than the first data object, to a second transformation function which is different than the first transformation function.

14. A system that includes one or more processors operable to associate at least one data transformation function to at least one data object, wherein the data transformation function is designated to transform the at least one data object from a first form received as input to a second form as output, wherein the data transformation function includes at least one tumbling transposing function, and wherein the at least one data transformation function is further designated to be applied to the at least one data object in connection with application of at least one of: (i) before one or more compression techniques designated to compress the at least one data object, and (ii) after one or more decompression techniques designated to decompress a compressed version of the at least one data object;
wherein the at least one data object is represented as one or more N×K byte sized partitions of monotonically increasing fixed-length values of size K, wherein N and K are positive integers greater than one;
wherein the at least one data transformation function includes a tumbling N×K byte matrix transpose function that can be applied to the one or more N×K byte sized partitions;
wherein the at least one data transformation function also includes a tumbling K×N byte matrix transpose function as the inverse function of the tumbling N×K byte matrix transpose function;
wherein the tumbling N×K byte matrix transpose function is also designated to be used with a dictionary-based compression technique, and
wherein the K×N byte matrix transpose function is also designated to be used with a dictionary-based decompression technique.

15. A non-transient computer readable storage medium storing at least computer executable code in a tangible form, wherein the computer executable code includes least computer executable code that when executed by a computing system causes association of at least one data transformation function to at least one data object, wherein the data transformation function is designated to transform the at least one data object from a first form received as input to a second form as output, wherein the data transformation function includes at least one tumbling transposing function, and wherein the at least one data transformation function is further designated to be applied to the at least one data object in connection with application of at least one of: (i) before one or more compression techniques designated to compress the at least one data object, and (ii) after one or more decompression techniques designated to decompress a compressed version of the at least one data object;
wherein the at least one data object is represented as one or more N×K byte sized partitions of monotonically increasing fixed-length values of size K, wherein N and K are positive integers greater than one;
wherein the at least one data transformation function includes a tumbling N×K byte matrix transpose function that can be applied to the one or more N×K byte sized partitions;
wherein the at least one data transformation function also includes a tumbling K×N byte matrix transpose function as the inverse function of the tumbling N×K byte matrix transpose function;
wherein the tumbling N×K byte matrix transpose function is also designated to be used with a dictionary-based compression technique, and
wherein the K×N byte matrix transpose function is also designated to be used with a dictionary-based decompression technique.

16. An Extensible system for writing and reading compressed data objects, comprising:
one or more processors operable to:
receive a data object and a compression method, wherein the data object is represented as one or more N×K byte sized partitions of monotonically increasing fixed-length values of size, wherein N and K are positive integers greater than one;
determine a transformation function for the data object and compression method, wherein the data transformation function includes at least one tumbling transposing function, wherein the transposing function includes a tumbling N×K byte matrix transpose function that can be applied to the one or more N×K byte sized partitions; wherein the at least one data transformation function also includes a tumbling K×N byte matrix transpose function as the inverse function of the tumbling N×K byte matrix transpose function; wherein the tumbling N×K byte matrix transpose function is also designated to be used with a dictionary-based compression technique, and wherein the K×N byte matrix transpose function is also designated to be used with a dictionary-based decompression technique;
form a transformed data object by applying the transformation function to the data object before applying the compression method to compress the data; and
write the transformed data and compressed data object to a storage.

17. The extensible system of claim 16, wherein the one or more processors are further operable to:
receive one or more other transformation functions and one or more other compression methods to be considered in the determining of the transformation function for the data object.

18. The extensible system of claim 16, wherein the one or more processors are further operable to:
determine an inverse transformation function and a decompression method for the transformed and compressed data object stored in the storage;
form transformed data object by applying the decompression method to the transformed and compressed data object; and form a data object by applying the inverse transformation function to said transformed data object.

19. The extensible system of claim 16, wherein the determining of the transformation function for the data object and compression method comprises determining an associated transformation function by examining an information repository and determining a specific association that associates a transformation function and the data object and the compression method.

20. The extensible system of claim 16, wherein the determining of the transformation function for the data object and compression method comprises associating a transformation function and data object class of the data object and the compression method.

21. The extensible system of claim 16, wherein the determining of the transformation function for the data object and compression method comprises:
   determining an associated transformation function by examining an information repository; and
   determining, based on the examining of the information repository, a dynamic association between a transformation function and the compression method by determining a data distribution method for the compression method that evaluates to true on the data object.

22. The extensible system of claim 16, wherein the data object includes N×K byte sized partitions of monotonically increasing fixed-length values of size K; the transformation function is an associated transformation function including a tumbling N×K byte matrix transpose function, and the compression and decompression methods are dictionary-based compression methods with a fixed-sized window.

23. The extensible system of claim 22, wherein the data object includes a columnar offset data structure of monotonically increasing K byte values, and the associated transformation function is a tumbling N×K byte matrix transpose function.

24. The extensible system of claim 22, wherein the associated transformation function was determined by a data distribution detection method that collects a sequential sample of the data object contents, and determines from the sample that the data object contains N×K byte sized partitions of monotonically increasing values.

25. The extensible system of claim 22, wherein K is a factor of 8 and N is a factor of 32K; and the compression and decompression methods are one of: LZ77 and LZ78.

* * * * *